United States Patent
Chhajed et al.

(10) Patent No.: US 11,088,291 B2
(45) Date of Patent: Aug. 10, 2021

(54) ULTRA-LOW REFLECTANCE BROADBAND OMNI-DIRECTIONAL ANTI-REFLECTION COATING

(71) Applicant: Rensselaer Polytechnic Institute, Troy, NY (US)

(72) Inventors: Sameer Chhajed, Troy, NY (US); Jong Kyu Kim, Watervliet, NY (US); Shawn-Yu Lin, Niskayuna, NY (US); Mei-Ling Kuo, Troy, NY (US); Frank W. Mont, Poughkeepsie, NY (US); David J. Poxson, Troy, NY (US); E. Fred Schubert, Troy, NY (US); Martin F. Schubert, Troy, NY (US)

(73) Assignee: Rensselaer Polytechnic Institute, Troy, NY (US)

(*) Notice: Subject to any disclaimer, the term of this patent is extended or adjusted under 35 U.S.C. 154(b) by 100 days.

(21) Appl. No.: 15/216,933

(22) Filed: Jul. 22, 2016

(65) Prior Publication Data
US 2017/0084760 A1  Mar. 23, 2017

Related U.S. Application Data

(62) Division of application No. 12/736,278, filed as application No. PCT/US2009/038600 on Mar. 27, 2009, now abandoned.
(Continued)

(51) Int. Cl.
*H01L 31/0216* (2014.01)
*C09D 1/00* (2006.01)
(Continued)

(52) U.S. Cl.
CPC .......... *H01L 31/02168* (2013.01); *C09D 1/00* (2013.01); *C09D 5/006* (2013.01);
(Continued)

(58) Field of Classification Search
CPC .......... H01L 31/02168; H01L 31/1844; H01L 31/0203
See application file for complete search history.

(56) References Cited

U.S. PATENT DOCUMENTS 5,820,926 A * 10/1998 Lien .................. G03F 7/091
                                                   427/162
6,274,295 B1   8/2001 Dammel et al.
(Continued)

OTHER PUBLICATIONS

Lien et al., "Tri-layer antireflection coatings (SiO2/SiO2—TiO2/TiO2) for silicon solar cells using a sol-gel technique", Solar Energy Materials & Solar Cells 90 (2006) 2710-2719. (Year: 2006).*
(Continued)

*Primary Examiner* — Tae-Sik Kang
(74) *Attorney, Agent, or Firm* — Murtha Cullina LLP; Anthony P. Gangemi

(57) ABSTRACT

An anti-reflection coating has an average total reflectance of less than 10%, for example less than 5.9% such as from 4.9% to 5.9%, over a spectrum of wavelengths of 400-1100 nm and a range of angles of incidence of 0-90 degrees with respect to a surface normal of the anti-reflection coating. An anti-reflection coating has a total reflectance of less than 10%, for example less than 6% such as less than 4%, over an entire spectrum of wavelengths of 400-1600 nm and an entire range of angles of incidence of 0-70 degrees with respect to a surface normal of the anti-reflection coating.

15 Claims, 24 Drawing Sheets

Related U.S. Application Data

(60) Provisional application No. 61/197,905, filed on Oct. 31, 2008, provisional application No. 61/054,289, filed on May 19, 2008, provisional application No. 61/039,806, filed on Mar. 27, 2008.

(51) Int. Cl.
*G02B 1/115* (2015.01)
*C09D 5/00* (2006.01)
*H01L 31/0203* (2014.01)

(52) U.S. Cl.
CPC .......... *G02B 1/115* (2013.01); *H01L 31/0203* (2013.01); *Y02E 10/50* (2013.01); *Y10T 428/24124* (2015.01); *Y10T 428/24975* (2015.01); *Y10T 428/249924* (2015.04); *Y10T 428/249962* (2015.04)

(56) References Cited

U.S. PATENT DOCUMENTS

| | | | |
|---|---|---|---|
| 9,123,838 B2 * | 9/2015 | Fogel | H01L 31/022425 |
| 2004/0156589 A1 | 8/2004 | Gunn et al. | |
| 2004/0263983 A1 | 12/2004 | Acree | |
| 2006/0182945 A1 | 8/2006 | Yoneyama et al. | |
| 2008/0087326 A1 | 4/2008 | Scholes et al. | |
| 2009/0075092 A1 * | 3/2009 | Varaprasad | H01L 31/18 428/428 |
| 2009/0236317 A1 | 9/2009 | Yost et al. | |
| 2011/0120554 A1 * | 5/2011 | Chhajed | C09D 1/00 136/259 |

OTHER PUBLICATIONS

International Search Report and Written Opinion dated Feb. 25, 2010, in PCT/US2009/038600, 14 pages.

International Preliminary Report on Patentability dated Oct. 7, 2010, PCT/US2009/038600, 9 pages.

Joo et al., "Block Copolymer Film with Sponge-Like Nanoporous Structure for Antireflection Coating," Langmuir, Aug. 12, 2006, 22(19):7960-7963.

Kuo et al., "Realization of a near-perfect antireflection coating for silicon solar energy utilization," Optics Letters, Nov. 1, 2008, 33(21):2527-2529.

Lee et al., "ZnO Nanostructures as Efficient Antireflection Layers in Solar Cells," NanoLetters, Apr. 17, 2008, 8(5):1501-1505.

Menna et al., "Porous silicon in solar cells: A review and a description of its application as an AR coating," Solar Energy Materials and Solar Cells, Apr. 30, 1995, 37(1):13-24.

SABIC-IP—Reflectance Curves. https://www.sabic-ip.com/staticcxp.user/en/LearnAboutColor/ColorBasicsDetail/reflectance_curves.html.

Schubert et al., "Design of multilayer antireflection coatings made from co-sputtered and low-refractive-index materials by genetic algorithm," Optics Express, Apr. 14, 2008, 16(8):5290-5298.

Strehlke et al., "Design of porous silicon antireflection coatings for silicon solar cells," Materials Science and Engineering: B, Oct. 25, 2000, 69-70(1):81-86.

Xi et al., "Optical thin-film materials with low refractive index for broadband elimination reflection," Nature Photonics, Mar. 1, 2007, 1(3):176-179.

* cited by examiner

Figure 4A
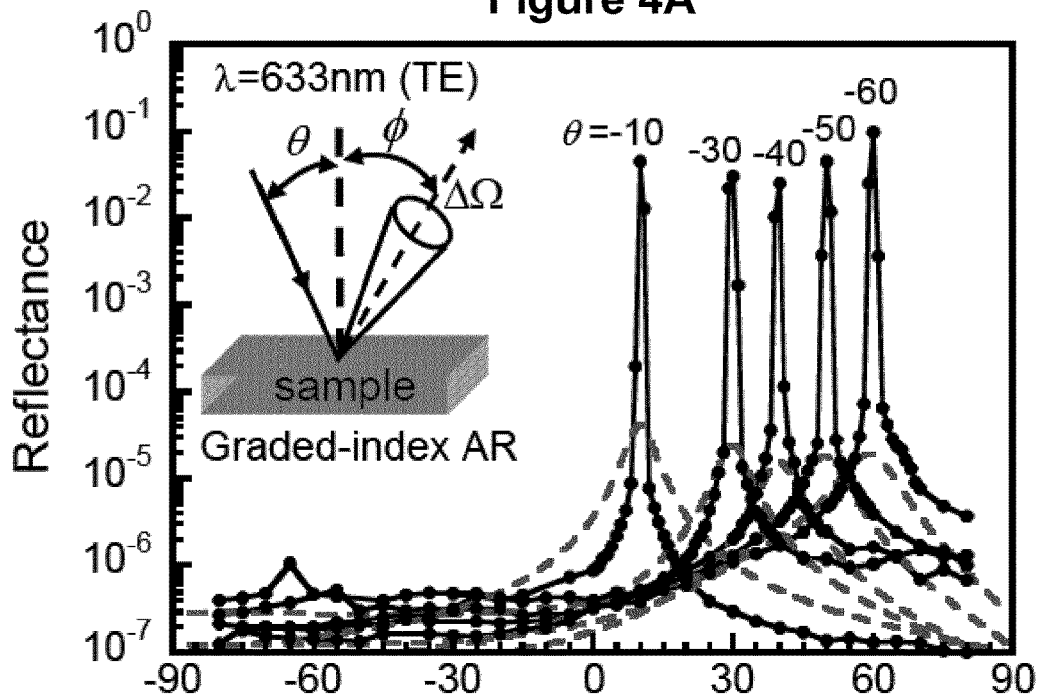
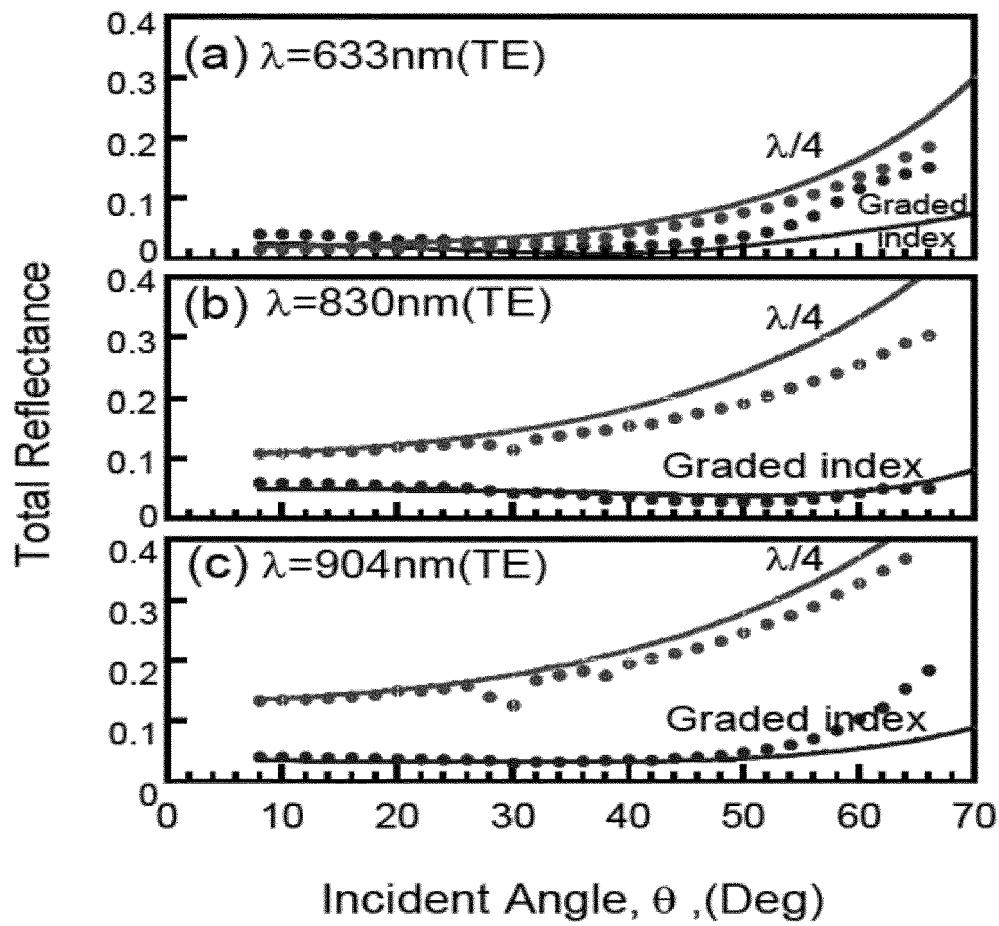
Figure 4B

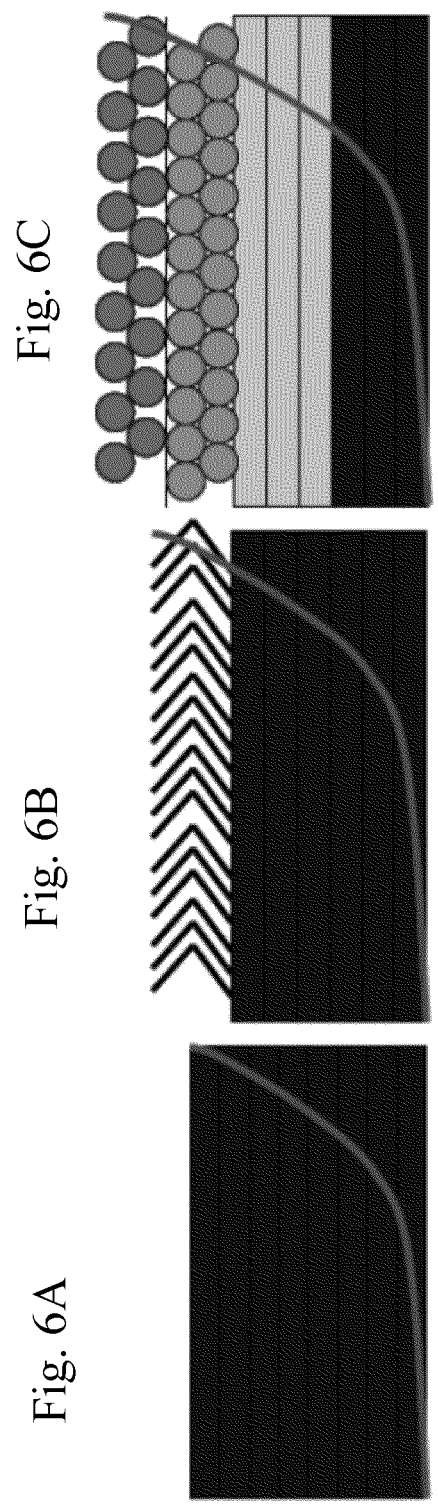

Fig. 9A
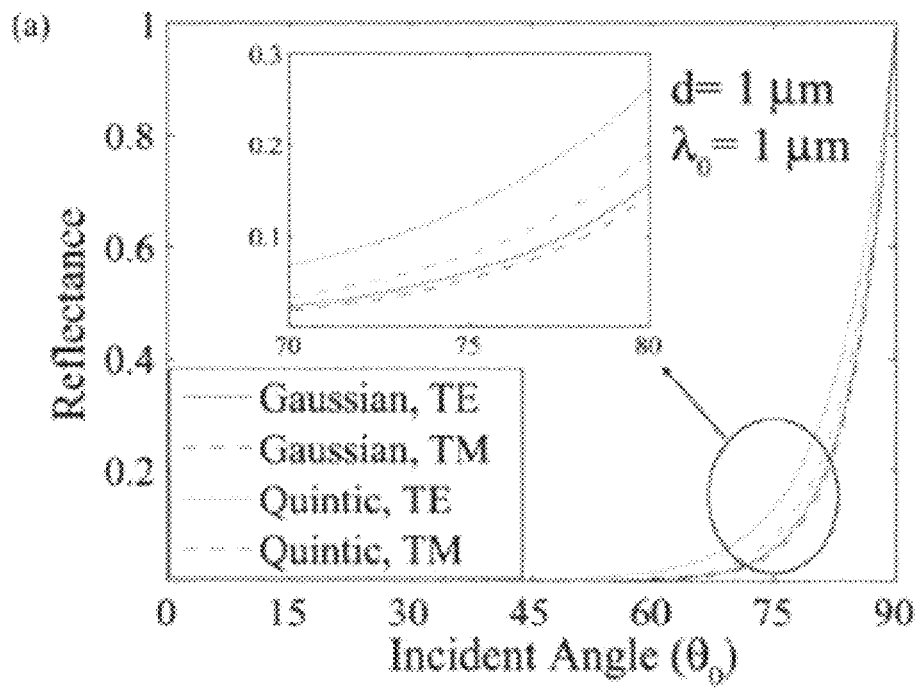
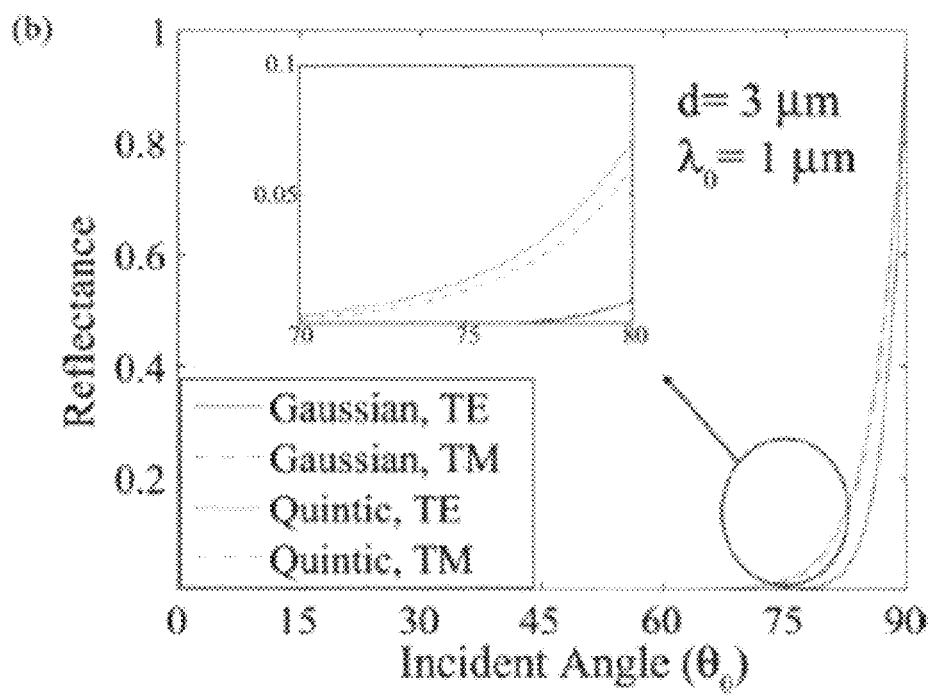
Fig. 9B (a)
Si substrate with no AR coating (b)
Si with λ/4 AR coating (c)
Si substrate with 3-layer AR coating

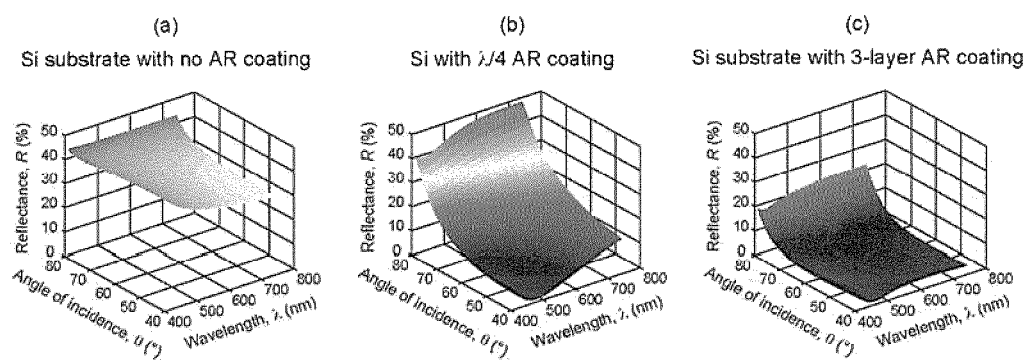
Figure 23A  Figure 23B  Figure 23C

ULTRA-LOW REFLECTANCE BROADBAND OMNI-DIRECTIONAL ANTI-REFLECTION COATING

CROSS-REFERENCE TO RELATED PATENT APPLICATIONS

This application is a Divisional of U.S. application Ser. No. 12/736,278, filed Dec. 17, 2010, now abandoned, which is the U.S. National Stage of PCT/US2009/038600, filed Mar. 27, 2009, which claims benefit of priority of U.S. Provisional Application Ser. No. 61/039,806 filed on Mar. 27, 2008, U.S. Provisional Application Ser. No. 61/054,289 filed on May 19, 2008, and U.S. Provisional Application Ser. No. 61/197,905 filed on Oct. 31, 2008, which are incorporated herein by reference in their entirety.

STATEMENT REGARDING FEDERALLY-SPONSORED RESEARCH OR DEVELOPMENT

This invention was made with U.S. Government support under grant numbers DE-FG 02-06ER46347 awarded by the Department of Energy—Basic Energy Services, FA 955006110431 awarded by AFOSR, and NSF 0646439 awarded by the National Science Foundation. The U.S. Government has certain rights in the invention.

FIELD OF THE INTENTION

The present invention relates to an anti-reflection coatings and applications thereof.

SUMMARY OF THE INVENTION

One embodiment of this invention provides an anti-reflection coating having an average total reflectance of less than 10%, for example less than 5.9% such as from 4.9% to 5.9%, over a spectrum of wavelengths of 400-1100 nm and a range of angles of incidence of 0-90 degrees with respect to a surface normal of the anti-reflection coating.

Another embodiment of this invention provides an anti-reflection coating having a total reflectance of less than 10%, for example less than 6% such as less than 4%, over an entire spectrum of wavelengths of 400-1600 nm and an entire range of angles of incidence of 0-70 degrees with respect to a surface normal of the anti-reflection coating.

Another embodiment of this invention provides an anti-reflection coating, comprising one or more titanium oxide layers, one or more intermixed layers located over the one or more titanium oxide layers, and one or more slanted nanorod layers, the one or more slanted nanorod layers being located over the one or more intermixed layers.

Another embodiment of this invention provides an anti-reflection coating located over a substrate, the anti-reflection coating comprising a non-porous layer, a first slanted nanorod layer having a first porosity located over the non-porous layer, and a second slanted nanorod layer having a second porosity located over the first slanted nanorod layer.

Another embodiment of this invention provides anti-reflection coating, comprising a first slanted nanorod layer having a first porosity located over the non-porous layer and a second slanted nanorod layer having a second porosity located over the first slanted nanorod layer, where the index of refraction profile of the anti-reflection coating has an approximate Gaussian distribution.

Still another embodiment of this invention provides a method of making an anti-reflection coating, comprising depositing one or more titanium oxide layers, depositing one or more co-sputtered layers of titanium oxide and silicon oxide over the one or more titanium oxide layers, and depositing one or more slanted nanorod layers over the one or more co-sputtered layers titanium oxide and silicon oxide.

BRIEF DESCRIPTION OF THE SEVERAL VIEWS OF THE DRAWING

FIG. 4A shows an angular-dependent diffuse reflectance of 7-layer coating on silicon substrate at 633 nm; FIG. 4B shows total reflectance as a function of angle. Compared to reflectance between 7-layer coating and quarter-wavelength coating, the plot shows 7-layer coating has a weak wavelength dependence and has low reflectance from 0 to 70 degrees.

FIGS. 6A-6C schematically illustrate the structure of layer-by-layer coating with 6A thin film, 6B nanorods layer, and 6C porous structure which has gradually changing index profile.

FIGS. 9A-9B show Gaussian and Quintic gradient-index coating angular reflectance calculated for a wavelength of 1 μm with a physical thickness of 9A 1 μm and 9B 3 μm, respectively.

FIGS. 23A-23C show measured wavelength and angle resolved absolute reflectance of Si substrate with 23A no anti-reflection coating, 23B λ/4 anti-reflection coating, and 23C 3 layer graded-index anti-reflection coating.

DETAILED DESCRIPTION OF THE INVENTION

Figure 1:
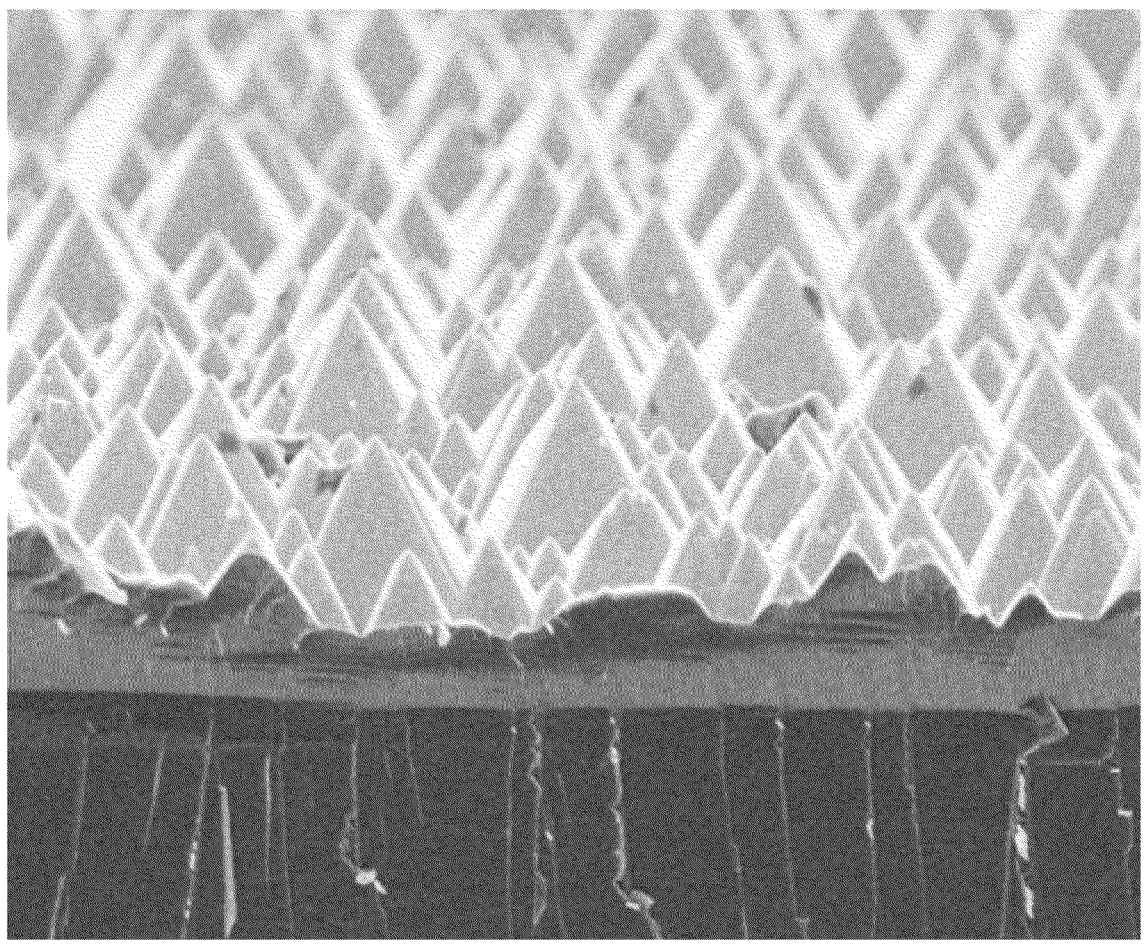
FIG. 1 shows a Scanning Electron Microscopy image of rough surface on a prior art solar cell.

One embodiment of this invention provides an anti-reflection coating having an average total reflectance of less than 10%, for example less than 5.9% such as from 4.9% to 5.9%, over a spectrum of wavelengths of 400-1100 nm and a range of angles of incidence of 0-90 degrees, such as 0-70 degrees, with respect to a surface normal of the anti-reflection coating. Another embodiment of this invention provides an anti-reflection coating having a total reflectance of less than 10%, for example less than 6% such as less than 4%, for example 1%-6% such as 1%-4%, over an entire spectrum of wavelengths of 400-1600 nm, including 400- 1100 nm such as 400-700 nm, and an entire range of angles of incidence of 0-70 degrees, including 0-60 degrees, with respect to a surface normal of the anti-reflection coating.

In some embodiments, the anti-reflection coating comprises at least one porous layer and at least one non-porous layer. In some embodiments, the at least one non-porous layer has an index of refraction of greater than 1.5, and the at least one porous layer has an index of refraction of 1.1 to 1.25 and a porosity of 10%-95% such as 90-95%. The at least one porous layer may comprise nano-scale structures or porous silica. For example, in some embodiments, the at least one porous layer comprises one or more slanted nanorod layers.

The one or more slanted nanorod layers may comprise at least a first slanted nanorod layer and a second slanted nanorod layer located over the first slanted nanorod layer. In some embodiments, the first slanted nanorod layer comprises nanorods slanted in a first direction, and the second slanted nanorod layer comprises nanorods slanted in a second direction different from the first direction. In some embodiments, the first slanted nanorod layer has a first porosity and a first tilt angle, defined as the angle of slanted nanorods with respect to substrate surface normal, and the second slanted nanorod layer has a second porosity different from the second porosity and a second tilt angle different from the first tilt angle. The anti-reflection coating may further comprise a barrier layer located between the first slanted nanorod layer and the second slanted nanorod layer. The barrier layer may be any suitable material, which is transparent and chemically resistive.

The nanorod layers may comprise nanorods made of any materials. For example, the nanorods may be made of at least one of silicon oxide, titanium oxide, silicon oxynitride, aluminum oxide, zinc oxide, transparent organic materials, or combinations thereof. Each of the one or more slanted nanorod layers may have a thickness of 20 nm to 500 nm, for example 20 nm to 100 nm. The tilt angle of the nanorods may be 0 to 70 degrees, for example 0 to 60 degrees. The porosity of the nanorod layers may be any desired porosity, for example 10% to 95% such as 10% to 90%.

In some embodiments, the anti-reflection coating may comprise at least three layers having index of refraction values that vary discretely from about 3.6 to about 1, for example from about 2.6 to about 1.09. An index of refraction profile of the anti-reflection coating may have an approximate Gaussian or Quintic distribution and be smooth to a first derivative and a second derivative. The anti-reflection coating has a total thickness of 1-5 optical wavelengths and each of the at least three layers has a thickness of around 500 nm or less, for example 100 nm or less.

Alternatively, the anti-reflection coating has a continuous index of refraction profile varying from about 3.6 to about 1, for example from about 2.6 to about 1.09 and the index of refraction profile has an approximate Gaussian or Quintic distribution.

In some embodiments, an anti-reflection coating may be located over a substrate, and comprise a non-porous layer, a first slanted nanorod layer having a first porosity located over the non-porous layer, and a second slanted nanorod layer having a second porosity located over the first slanted nanorod layer. The second porosity is greater than the first porosity. In some embodiments, the anti-reflection coating may further comprise a third slanted nanorod layer having a third porosity greater than the second porosity.

In some embodiments, an anti-reflection coating comprises one or more titanium oxide layers, one or more intermixed layers located over the one or more titanium oxide layers, and one or more slanted nanorod layers, the one or more slanted nanorod layers being located over the one or more intermixed layers.

In some embodiments, the one or more intermixed layers may be non-porous and comprise at least a first intermixed layer having a first composition and a second intermixed layer having a second composition different from the first composition located over the first intermixed layer. The one or more intermixed layers may comprise at least one layer of co-sputtered titanium oxide and silicon oxide.

The one or more slanted nanorod layers are porous and comprise at least a first slanted nanorod layer and a second slanted nanorod layer located over the first slanted nanorod layer. In some embodiments, the first slanted nanorod layer comprises nanorods slanted in a first direction and the second slanted nanorod layer comprises nanorods slanted in a second direction different from the first direction.

In some embodiments, the first titanium oxide layer has an index of refraction of around 2.60, the second titanium oxide layer has an index of refraction of around 2.52, the first intermixed layer comprises a first composition of silicon oxide and titanium oxide and has an index of refraction of around 2.24, the second intermixed layer comprises a second composition of silicon oxide and titanium oxide and has an index of refraction of around 1.86, the first slanted nanorod layer has an index of refraction of around 1.72, and the second slanted nanorod layer has an index of refraction of around 1.09. In some other embodiments, the one or more titanium oxide layers are non-porous and comprise a titanium oxide layer, the one or more intermixed layers are non-porous and comprise a co-sputtered layer of around 63% silicon oxide and around 37% titanium oxide, the second intermixed layer comprises a second composition of silicon oxide and titanium oxide and has a porosity of 19%, where the first slanted nanorod layer has a porosity of 71% and the second slanted nanorod layer has a porosity of 90%.

Still another embodiment of this invention provides a method of making an anti-reflection coating, comprising depositing one or more titanium oxide layers, depositing one or more co-sputtered layers of titanium oxide and silicon oxide over the one or more titanium oxide layers, and depositing one or more slanted nanorod layers over the one or more co-sputtered layers titanium oxide and silicon oxide.

In some embodiments, the step of depositing one or more slanted nanorod layers comprises depositing a first slanted nanorod layer having a first porosity, depositing a second slanted nanorod layer having a second porosity located over the first slanted nanorod layer. The second porosity is greater than the first porosity. In some embodiments, the first slanted nanorod layer comprises nanorods slanted in a first direction, and the second slanted nanorod layer comprises nanorods slanted in a second direction different from the first direction. In some embodiments, the step of depositing one or more slanted nanorod layers may further comprise depositing a third slanted nanorod layer having a third porosity greater than the second porosity.

The step of depositing one or more slanted nanorod layers may comprises depositing slanted nanorods with a predetermined tilt angle and porosity. The slanted nanorods may be deposited by any suitable methods, for example, by oblique angle deposition. In some embodiments, different tilt angles can be used for different layers.

In some embodiments, the method further comprises depositing a barrier layer over the first slanted nanorod layer, prior to the step of depositing the second slanted nanorod layer. Preferably, the barrier layer is transparent and chemically resistive.

During the step of depositing one or more slanted nanorod layers, a plurality of pores are formed between the nanorods, while during the step of depositing the one or more co-sputtered layers or the step of depositing the one or more titanium oxide layers, substantially no pores are formed.

The one or more slanted nanorod layers may comprise at least one of silicon oxide, titanium oxide, silicon oxynitride, aluminum oxide, zinc oxide, transparent organic materials, or combinations thereof. Each of the one or more slanted nanorod layers has a thickness of 20 nm to 500 nm, for example 20 nm to 100 nm, and the nanorods have a tilt angle of 0 to 60 degrees.

In some embodiments, during the step of depositing the one or more co-sputtered layers at least one of sputtering parameters varies in real time in such a way that the one or more co-sputtered layers has a continuous composition profile, providing a continuous index of refraction profile. Examples for sputtering parameters include but are not limited to flow of reactive gas, sputtering speed, target composition, sputtering chamber pressure, bias added to sample, temperature, etc.

The anti-reflection coating may be used for any suitable applications, for example, an anti-reflection coating of solar cells, light-emitting diodes, image sensors, photo detectors, or any other optical components and devices where interfacial Fresnel reflections are undesirable.

The anti-reflection coating(s) described above may be applied to any type of solar cells. In one embodiment, the solar cell comprises a first electrode located over a substrate, at least one photovoltaic layer located over the first electrode, a second electrode located over the at least one photovoltaic layer and the anti-refection coating described above located over the second electrode. The solar cell may further comprise a protective layer located over the anti-reflection coating or between the anti-reflection coating and the second electrode.

Embodiment I

By reducing reflective losses at interfaces, an anti-reflection coating (AR coating) is an efficient application on a solar cell. Since solar radiation provides a broadband spectrum and solar cell devices can be made from several types of materials, a high efficient anti-reflection coating is required to not only have low-reflectance at all angles and all wavelengths but be suitable for various types of solar devices, such as silicon, silicon-film, gallium arsenide (GaAs), gallium antimonide (GaSb) and others.

Figure 2:
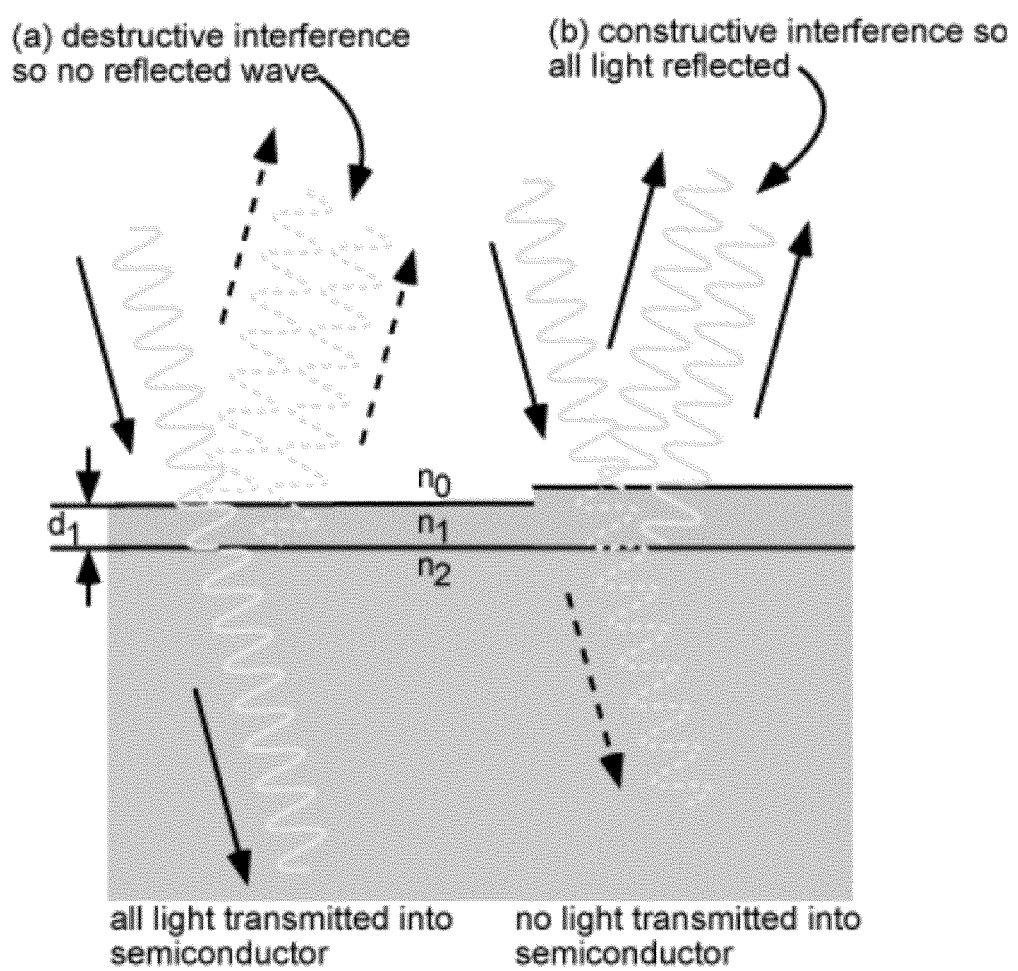
FIG. 2 illustrates conventional single layer coating (quarter-wavelength coating) on a prior art semiconductor solar cell.

There is a market need for maximizing solar collection efficiency from sun light and, thereby, increasing the net solar-to-electricity conversion efficiency. Specifically, FIG. 1 shows a Scanning Electron Microscopy image of a rough surface on a solar cell from a commercial solar cell. A conventional single layer coating (quarter-wavelength coating) may be applied on semiconductor solar cell to improve the collection efficiency, as illustrated in FIG. 2. A single-layer quarter-wave anti-reflection coating can reach low reflectance only at normal incidence and at single wavelength. For a rough surface, it can confine incoming light by reducing only certain amount reflectance.

In addition to single-layer quarter wave coating, technologies such as periodic surface structure modification, and a random surface structure may also be used to improve the collection efficiency. However, most anti-reflection layer coating works for a narrow band of wavelengths (λ) and also over a small range of angles (θ) near normal incidence. This constraint limits the angle- and λ-averaged reflectance to about 35% for a bare silicon solar cell and 20% for a quarter-wave plate anti-reflection coating. To accommodate the limited angle-of-acceptance, some solar panels have to be built on a rotational tilt stage to track the sun light to maximize its efficiency. Currently, it is believed that there is no all-angle and all-wavelength (in solar spectrum) anti-reflection coating in the market place.

Figure 3A:
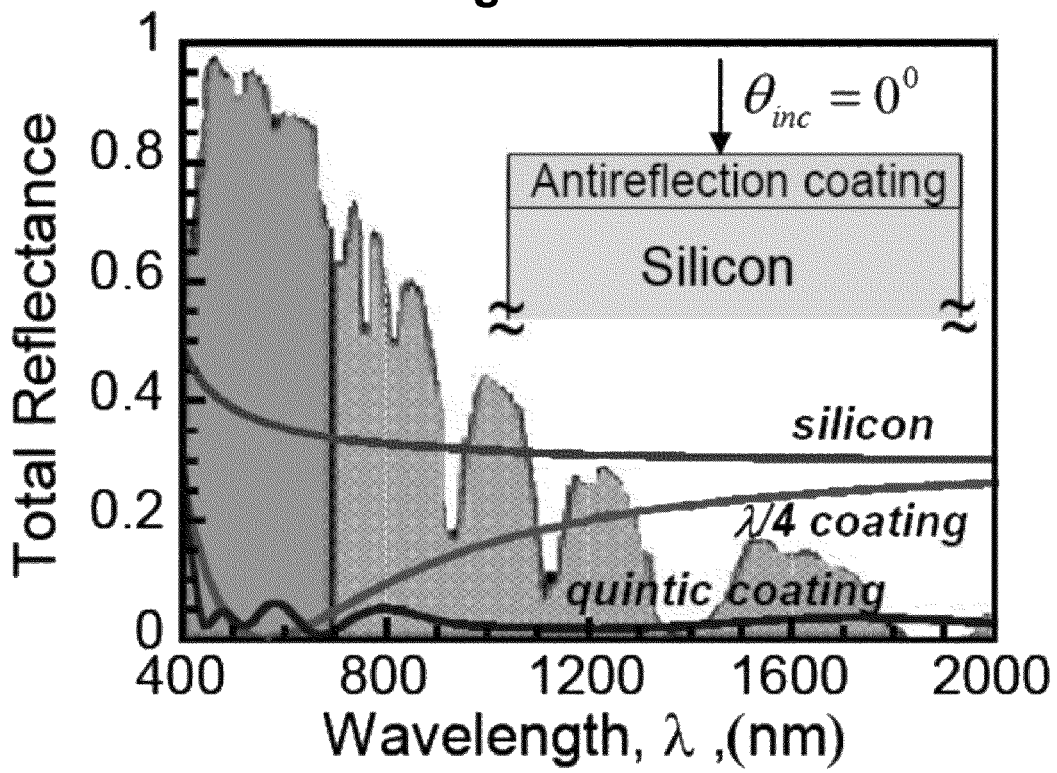
FIG. 3A shows total reflectance as a function of wavelength at normal incidence with solar spectrum.
Figure 3B:
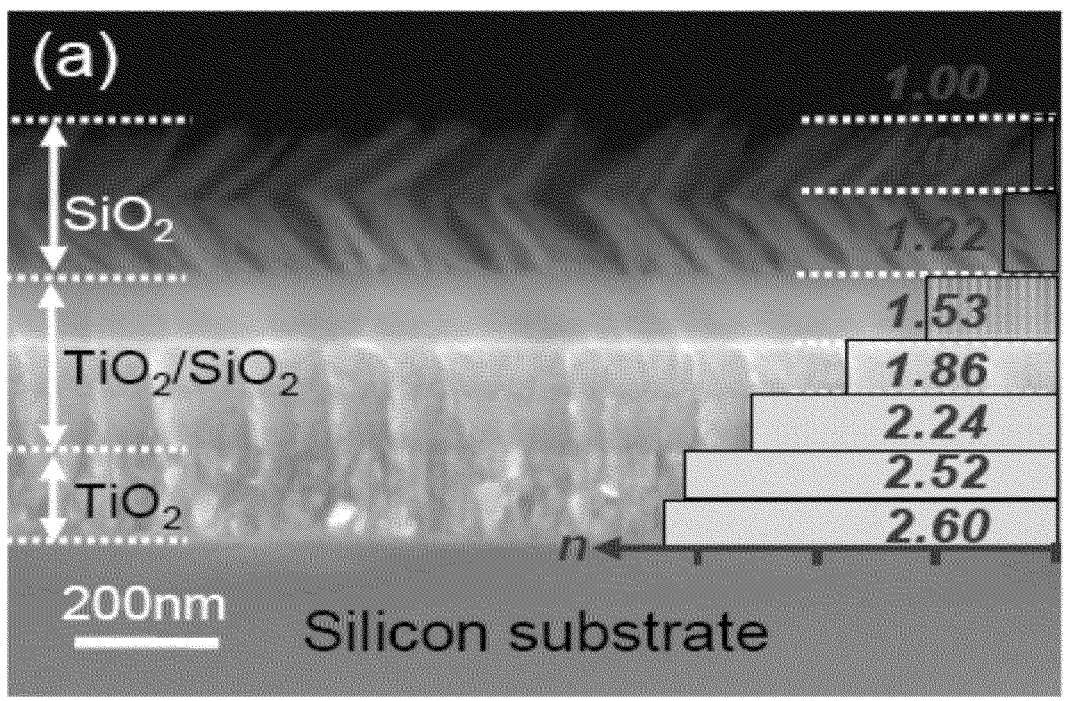
FIG. 3B shows a scanning electron microscopy image of Quintic graded-refractive-index 7-layer coating.

In this embodiment, an anti-reflection coating on a silicon substrate based on the Quintic profile design with seven graded-refractive-index layers is demonstrated. The various index of refraction profile can be obtained by varying structure and/or materials of layers. As shown in FIG. 3A, the total reflectance of the graded-refractive-index coating shows the lowest total reflectance over the entire wavelength range of solar spectrum at normal incidence. A scanning electron microscopy image of a non-limiting example is shown in FIG. 3B, which has a graded-refractive-index profile having an approximate Quintic distribution. Other index-gradient profile such as Quintic profile, Gaussian profile, or any other anti-reflection coating profile may also be used. The detail of the theoretical design/simulation has been described in Chen, M., et al. (Chen, M, et al., Applied Optics 2007, 46, 6533-6538).

FIG. 4A shows the measured reflectance plotted as a function of φ for a series of light incident angle, φ=−10°, −30°, −40°, −50°, and −60°, respectively. Light is TE-polarized and at λ=633 nm. The inset shows a schematic of the test setup. The data exhibits a δ-function like sharp reflection peak at |φ|=|θ| and a slight diffused component with $R_{diffu} \leq 10^{-7}$-$10^{-7}$. The diffused component may be fitted using a model calculation (dotted curves) and the percentage of diffuse reflectance to the total reflectance is: 1.88%, 2.0%, 1.76%, 1.32%, and 0.765% at θ=−10°, −30°, −40°, −50°, and −60°, respectively. This data illustrates that an graded-index coating can simultaneously accomplish a low total reflectance and a weak diffuse reflectance for a wide range of θ.

FIG. 4B shows a comparison of total reflectance vs θ for the λ/4 layer and graded-index anti-reflection coating samples at λ=633 nm (top), 830 nm (middle), and 904 nm (bottom), respectively. Both the measured (dots) and calculated (curves) data are shown. The light is TE polarized. For all-wavelengths, the total reflectance of the graded-index sample displays a weak angle-dependence for θ=0°-60° and also a weak wavelength-dependence. On the contrary, while the reflectance of a λ/4 anti-reflection coating is low at λ=633 nm and for θ=0-30 degrees, it increases rapidly at larger angles and at different wavelengths.

Figures 5A, 5B:
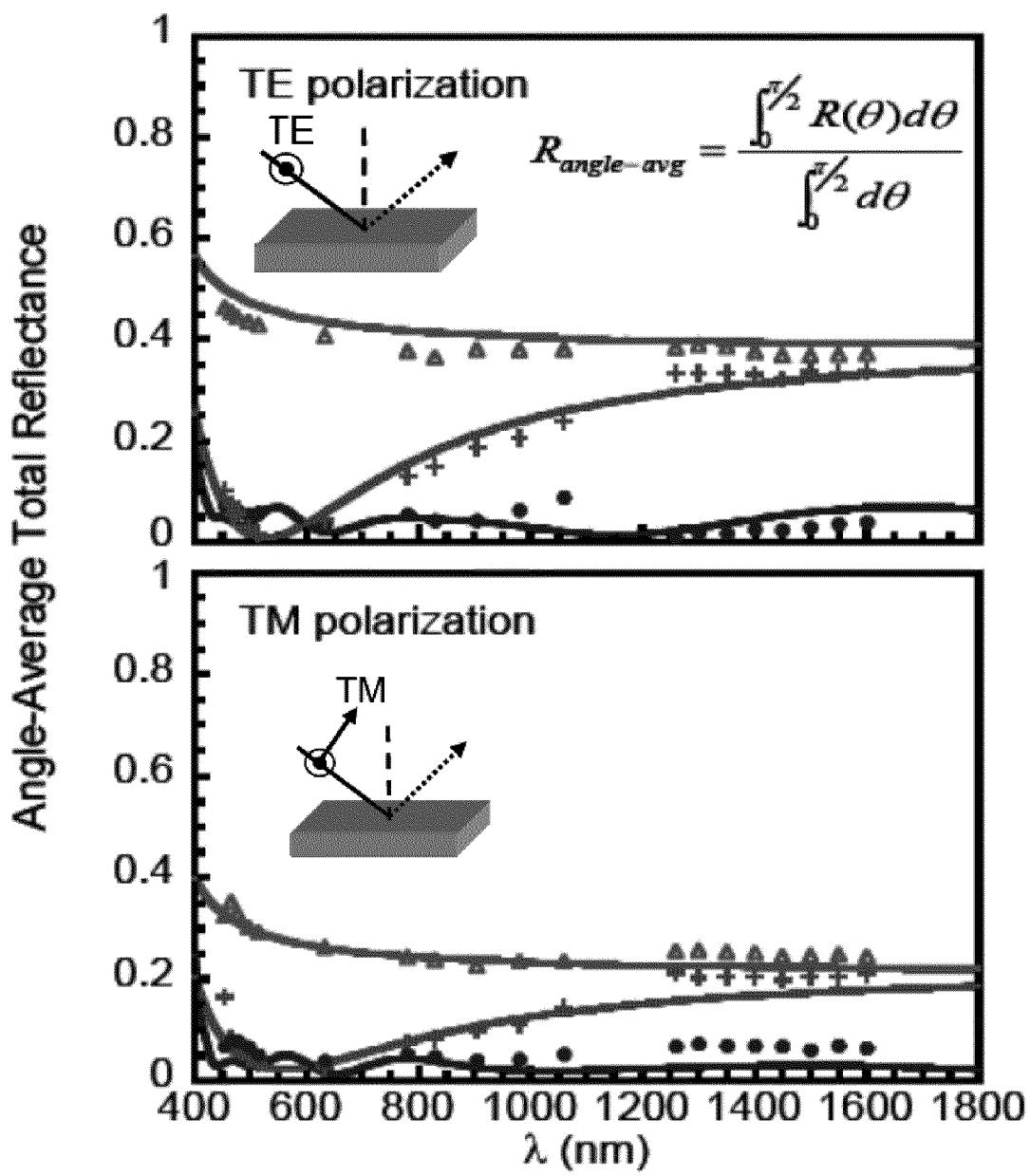
FIGS. 5A-5B show angle-average total reflectance as a function of wavelength at 5A TE polarization and 5B TM polarization, respectively. Angle-average total reflectance is defined by integration of total reflectance for 0 to 90 degrees at each wavelength. Total reflectance values measured at incident angle of 8 to 60 degrees are integrated. The 7-layer coating shows a low reflectance for all angles and all wavelengths at both TE and TM polarization.

FIG. 5A shows measured and calculated $R_{angle-avg}(\lambda)$ as a function of wavelength. Angle-average total reflectance is defined by integration of total reflectance for 0 to 90 degrees at each wavelength. Total reflectance values measured at incident angle of 8 to 60 degrees are integrated. The 7-layer coating shows a low reflectance for all-angles and all wavelengths at both TE and TM polarization. The schematic of sample and TE light polarization is shown in the inset. Comparing to the λ/4 coatings (the dots and curve), the graded-index coating (dots and curve) exhibits a much lower $R_{angle-avg}(\lambda)$ for the entire λ-range and is also a nearly λ-independent. FIG. 5B shows $R_{angle-avg}(\lambda)$ as a function of λ for TM-polarization. It exhibits a very similar functional dependence as that for the TM polarization. The overall $R_{angle-avg}(\lambda)$ is lower for TM than that for TE polarization due to the occurrence of Brewster angle for TM. For example, any suitable variations of the above explained structure having gradually changing index profile may be used. For example, structures of layer-by-layer coating with (1) non-porous thin films having different values of refractive index, with (2) a combination of non-porous layers with nanorod layers, or with (3) porous structures such as nano-engineered structures including nano-particles and porous layers etc., as illustrated in plots (1)-(3) in FIGS. 6A-6C, respectively.

Alternatively, the index of refraction profile can be continuous, by varying the index of refraction within each layer, for example, by varying the deposition parameters in real-time to continuously varying the composition or the porosity of the layers.

As further described below, in this non-limiting embodiment, an anti-reflection coating for eliminating Fresnel reflection at the surface of a solar cell over the entire solar spectrum, comprising a seven-layer graded-index coating with total reflectance of 1-6 percent, can be used to increase solar-to-electric efficiency by 20-42%. A graded-index coating wherein the differential reflectance as each layer surface is minimized by growing a discrete set of layered nanostructures (e.g. $TiO_2$ and/or $SiO_2$ slanted rods) to approximate the continuous index profile.

Embodiment II

Anti-reflection coatings are widely used to suppress undesired interfacial Fresnel reflections in optical components and devices. While the well-known single-layer quarter-wave film can, in theory, lead to zero reflection at a single wavelength, broadband anti-reflection coating is often needed for many applications. In practice, coating materials with the required refractive index for the quarter-wave antireflective film may not be available. To address these issues, a multilayer stack of homogeneous thin films was investigated extensively for over half a century (A. Mussett and A. Thelen, Progress in Optics Vol. 8, E. Wolf, ed. (North-Holland, 1970), pp. 203-237), resulting in the development of a rich variety of multilayer thin film schemes (J. A. Dobrowolski, Handbook of Optics, McGraw-Hill, 1995, pp. 42.19-42.34) and design methodologies (A. Thelen, Design of Optical Interference Coatings, McGraw-Hill, 1989), which are hereby incorporated by reference in their entireties.

An alternative broadband anti-reflection coating solution is a layer of inhomogeneous film with gradient-index in which the refractive index varies gradually and monotonically along its thickness from the ambient (usually air) index to the substrate index. Many specific gradient-index profiles including Quintic (W. H. Southwell, Opt. Lett. 8, 584-586, 1983), Gaussian (E. Spiller et al., Appl. Opt. 19, 3022-3026, 1980), Exponential (P. Yeh and S. Sari, Appl. Opt. 22, 4142-4145, 1983), Exponential-Sine (P. G. Verly, et al., Appl. Opt. 31, 3836-3846, 1992), and Klopfenstein (E. B. Grann, et al., J. Opt. Soc. Am. A 12, 333-339, 1995) have been investigated previously and are hereby incorporated by reference in their entireties.

Compared to multilayer uniform films, gradient-index anti-reflection coating can be less sensitive to the angle of incidence, and is thus desirable for use in applications such as solar cells (A. Gombert, et al., Sol. Energy 62, 177-188, 1998) and light-emitting diodes (Y. Kanamori, et al., IEEE Photon. Technol. Lett. 14, 1064-1066, 2002) that require effective anti-reflection coating over a wide range of incident angles and where the gradient-index can be implemented by techniques such as patterning of subwavelength surface-relief "moth eye" structures (P. B. Clapham and M. C. Hutley, Nature 244, 281-282, 1973), which are hereby incorporated by reference in their entireties. Yet, while numerous designs of multilayer anti-reflection coating for oblique incident angles were previously reported, there is relatively little literature on the design and performance of gradient-index anti-reflection coating at grazing incident angles. Recently, Poitras and his coworker (D. Poitras and J. A. Dobrowolski, Appl. Opt. 43, 1286-1295, 2004) pointed out that at oblique angles, a smooth variation of the spatially dependent refractive angle inside a gradient-index anti-reflection coating is necessary to reduce polarization splitting in reflectance of the film. They also noted that performance is significantly degraded at large refractive angles due to deformation of the index profile as seen by the light. To partly remedy this, they showed that by applying a spatial scaling to an index profile that effectively elongates the portion close to the ambient side, the resultant modified profile has improved performance at large incident angles over its original counterpart. However, this comes at the expense of increased physical thickness of the film and slight performance degradation at near-normal incidence.

In this non-limiting embodiment, a new principle for the design and selection of gradient-index anti-reflection coating profiles has been demonstrated to be effective over a wide range of incident angles as well as wavelengths, without the need for an extension of the film's thickness. It is shown that large variations in the optical path (which is characterized by the refractive angle) of incident light inside a gradient-index film directly lead to an increase in the overall reflection at oblique incidence. This effect becomes more prominent at large angles. Thus, it is the smoothness of variations in refractive angle rather than that of the index profile itself that needs to be maximized for wide-angle operation. As an example, the Gaussian profile outperforms the Quintic profile at large incident angles.

A. Design of Optical Path

Figure 7:
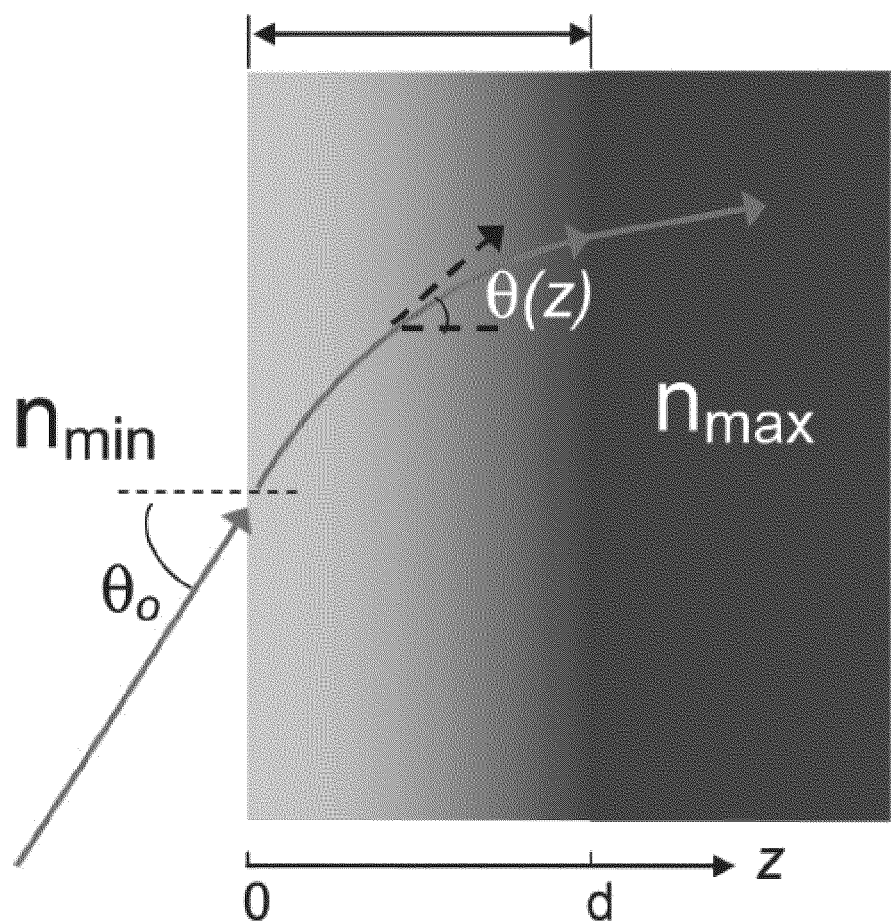
FIG. 7 illustrates geometry of a gradient-index anti-reflection coating.

In some embodiments, the geometry of a gradient-index anti-reflection coating shown in FIG. 7 may be used. The inhomogeneous film can be placed on a substrate with an index $n_{max}$, and the ambient is assumed to have an index $n_{min}$. The ambient-film interface is at z=0 while the film-substrate interface is at z=d, where z is the physical distance normal to the film surface. Inside the film the refractive index n(z) varies continuously from $n_{min}$ to $n_{max}$. All media are assumed to be non-dispersive and non-absorbing. Light is incident upon the film surface from the ambience at an angle $\theta_0$, and inside the film the tangential propagation direction of light is characterized by the spatially dependent refractive angle θ(z).

To obtain a gradient-index profile, the optical thickness x may be an important factor. In some embodiments, the incremental optical thickness Δx can be related to the incremental physical thickness Δz by Δz=Δx/n(x), so that $$z = \int_0^x \frac{dx'}{n(x')}. \quad (1)$$

At oblique incidence, the optical characteristics of the film are different for TE and TM incident polarizations. The characteristic index for the two polarizations can be defined in terms of the optical thickness as $$n_{TE}(x) = n(x)\cos(\theta(x)), \quad (2a)$$

$$n_{TM}(x) = n(x)/\cos(\theta(x)), \quad (2b)$$

Where cos(θ(x)) is obtained by $$\cos(\theta(x)) = \left[1 - \frac{n_{min}}{n(x)}\sin(\theta_0)\right]^{1/2}. \quad (3)$$

The refractive angle within the coating, θ(x), can be obtained from Snell's law, that determines the optical path of light propagating inside the coating. By the law of reflection at the interface of two optical materials (Fresnel reflection), the incremental reflectance $dr_{TE}(x)$ within the coating for the TE polarization is then given by $$dr_{TE}(x) = \left[\frac{n_{TE}(x) - n_{TE}(x+dx)}{n_{TE}(x) + n_{TE}(x+dx)}\right]^2 \quad (4)$$
$$\approx \left[\frac{dn_{TE}(x)}{2n_{TE}(x)}\right]^2.$$

The incremental reflectance for TM polarization has exactly the same form but with $n_{TM}(x)$ instead. The continuous index function can be treated as an infinite series of discrete lamellar layers of thickness of dx and calculate the reflectance as a function of x directly by the Fresnel equation, Eq. (4). At a large angle of incidence, cos(θ(x)) may approach zero, leading to a great variation of the characteristic index in tiny increments of θ(x). Therefore, the reflectance would be significantly increased according to Eq. (4). Thus, without wishing to be bound to a particular theory, the inventors believe that the variation of refractive angle within the coating has great influence on the performance of gradient-index anti-reflection coatings.

Figure 8:
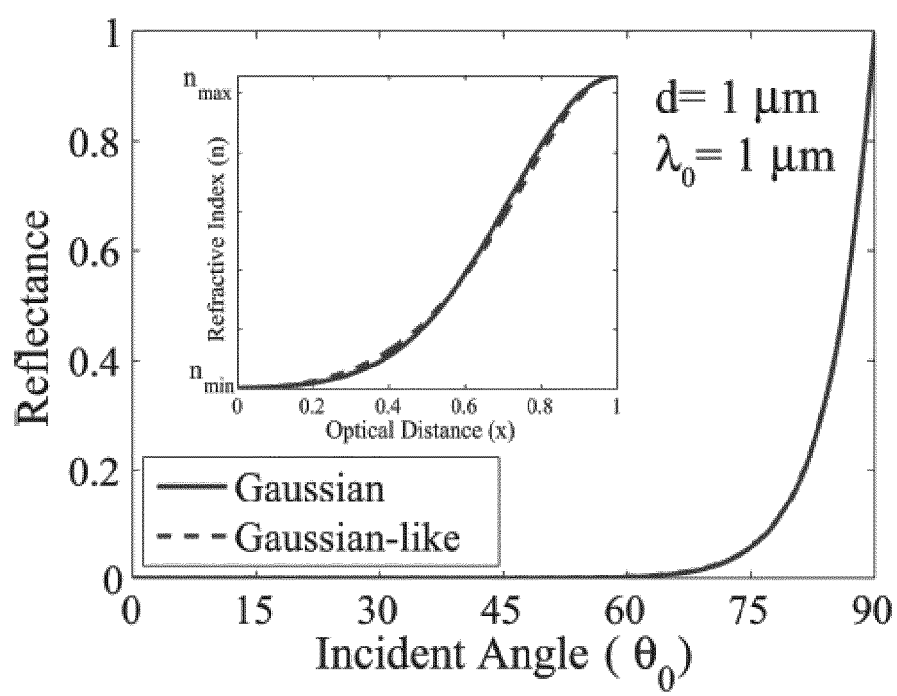
FIG. 8 shows comparison of reflectance under Gaussian and Gaussian-type profiles for a wavelength of $\lambda=1$ μm with $d=1$ μm physical thickness. Inset is the Gaussian and Gaussian-type profile.

Smooth refractive index profile of the anti-reflection coatings is favorable for an optimal reflectance. In some embodiments, the refractive angle can be smoothly varied within the coating to build an index profile. As a non-limiting example, the variation of refractive angle of a well-known smooth sinusoidal function at incident angle of $\theta_0=75°$, as described below, is used for building the index profile:

$$n(x) = \frac{n_{min}\sin\theta_0}{\sin\{\theta_0 + (\theta_1 - \theta_0)[1 - \cos(\pi x/2]\}}, \quad (5)$$

where $\theta_1$ is the refractive angle in the substrate. The index profile according to Eq. (5) are in fact very close to a Gaussian profile as illustrated in FIG. 8, and thus are referred to as "a Gaussian-type profile" in the following description. Furthermore, its anti-reflective characteristics of a layer is also similar to that the Gaussian profile as illustrated in FIG. 8.

$$n(x) = n_{min} + (n_{max} - n_{min})\exp\left[-\left(\frac{x-1}{0.4}\right)^2\right], \quad (6)$$

To illustrate the effect of smoothness of refractive angle profile, the performance of the Gaussian according to Eq. (6) and Quintic profile according to Eq. (7) are compared.

$$n(x) = n_{min} + (n_{max} - n_{min})(10x^3 - 15x^4 + 6x^5). \quad (7)$$

These two index profiles are expressed in terms of their optical distance, x. While the physical thickness is the actual coating thickness, the optical thickness can be regarded as the imaginary thickness seen by the electromagnetic wave.

With optical thickness, $x=1\lambda_0$, where $\lambda_0$ is the wavelength in vacuum, Quintic exhibits physical thickness of $Z_{Quintic}=0.74$, while Gaussian has $Z_{Gaussian}=0.78\lambda_0$.

FIGS. 9A-9B show the calculated reflectance of the two profiles as a function of incident angle. Insets are the zoom-in diagrams. The light is assumed to be incident from air ($n_{min}=1.0$) with wavelength of $\lambda_0=1$ µm and the substrate is assumed to be aluminum nitride ($n_{max}=2.06$). Two physical thicknesses of 1 µm 9A and 3 µm 9B are used. As shown in FIGS. 9A and 9B, the Gaussian and Quintic profiles show little difference at low incident angle. However, the significant difference is revealed once the incident angle goes to above 60°. Furthermore, the TE polarization is indiscernible to the TM polarization under Gaussian while the polarizations are split with Quintic. Without wishing to be bound to a particular theory, the inventors believe that the reduced polarization splitting under the Gaussian profile is an evidence that variation of the refractive angle in Gaussian is smoother than that in the Quintic.

A comparison of results shown in FIGS. 9A and 9B shows that a 3 µm thick coating gives a better performance than the 1 µm coating. Without wishing to be bound to a particular theory, the inventors believe that the better performance of the structure having a thickness of 3 µm may be attributed to a smoother index variation. If an unpolarized light is illuminated from $\theta_0=0$ to $\theta_0=\pi$ uniformly, the average reflectance may be obtained by integrating the reflectance's overall angle and dividing the integration by $\pi$. For 1 µm thickness, the Gaussian and Quintic give an angle-averaged reflectance of 5.93% and 7.53%, respectively. The result shows that the Gaussian profile reduces reflectance by about 1.6% compared with Quintic.

Figure 10A:
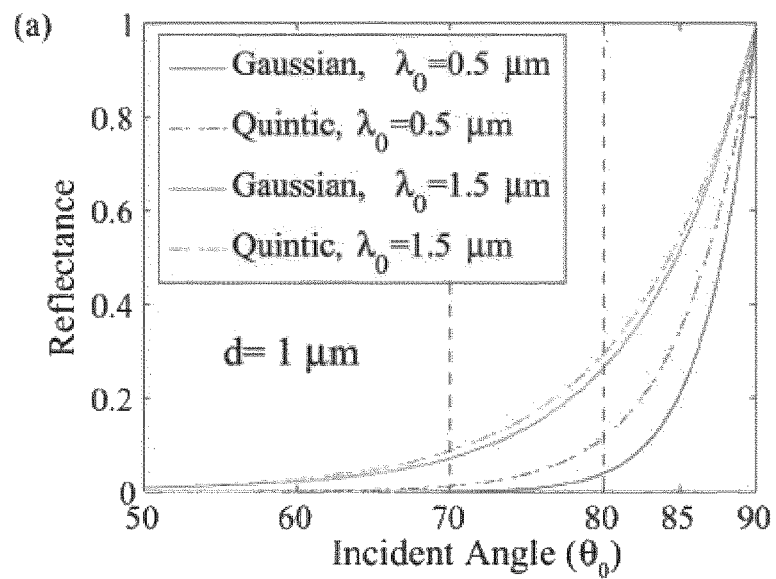
FIG. 10A shows Gaussian and Quintic gradient-index coating angular reflectance calculated with a physical thickness of 1 μm.
Figure 10B:
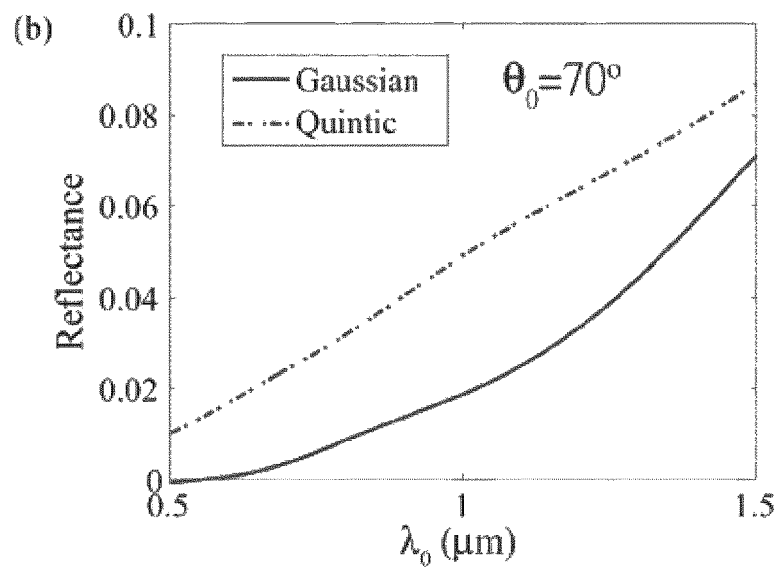
FIGS. 10B-10C show the spectral reflectance calculated with a physical thickness of 1 μm for $\theta_0=70$ degree incident angle 10B and 80 degree incident angle 10C, respectively.
Figure 10C:
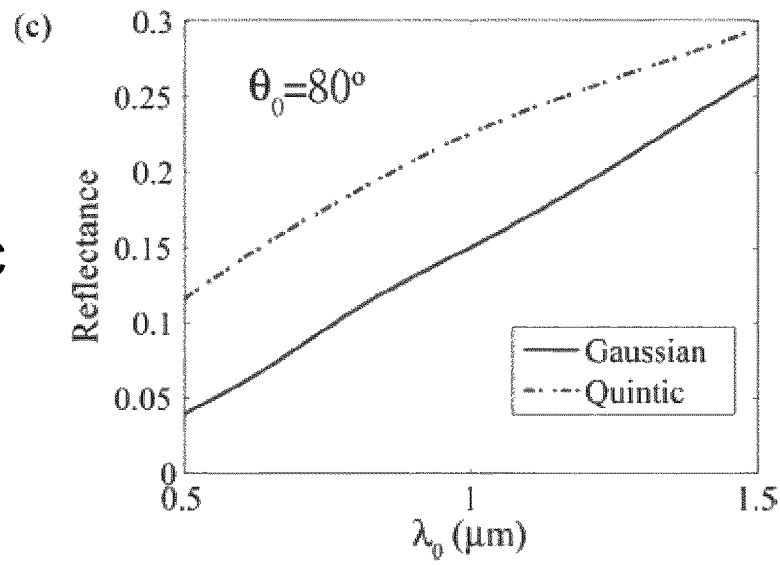

FIG. 10A shows the reflectance with a different wavelength at coating thickness of 1 µm. The unpolarized reflectance is given by the average of TE and TM polarizations. Without wishing to be bound to a particular theory, the inventors believe that that the shorter wavelength performs better due to the relatively high ratio ($d/\lambda_0$) of coating thickness to wavelength. The reflectance as a function of wavelength at two angles of incidence, $\theta_0=70°$ and $\theta_0=80°$ is shown in FIGS. 10B and 10C, respectively. The Gaussian profile shows a better performance over a wide range of wavelength. It was previously shown that the Gaussian profile can have better performance than the Quintic at normal incidence (E. B. Grann, et al. J. Opt. Soc. Am. A 12, 333-339, 1995). It is further shown here that the same holds true at oblique incidence, and we can consider the refractive angle within the two profiles to gain some physical understanding.

Figure 11A:
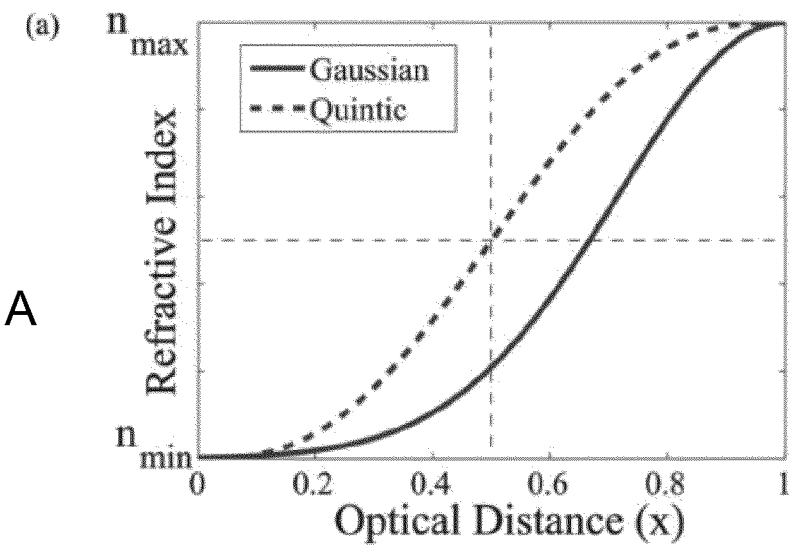
FIG. 11A shows index profile plotted for the Gaussian (solid curve) and Quintic profile (dashed curve), respectively. These two profiles are normalized to optical distance.
Figure 11B:
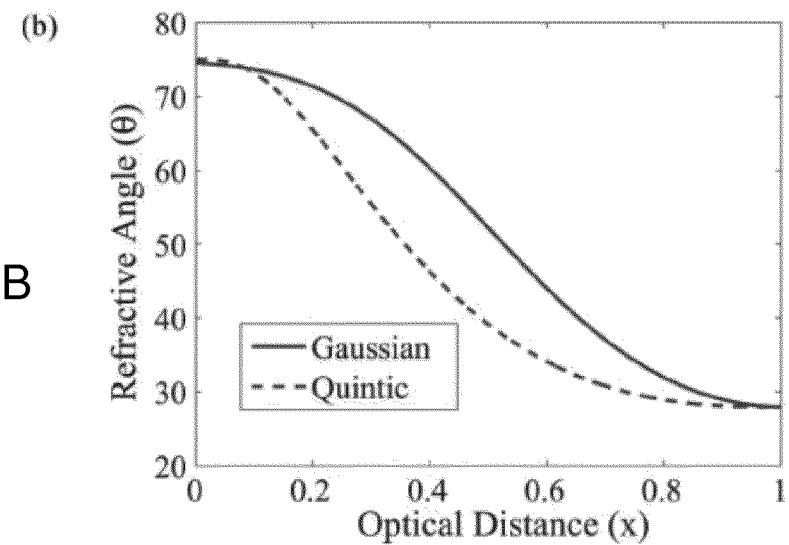
FIG. 11B shows refractive angle within the Gaussian and Quintic coating.
Figure 11C:
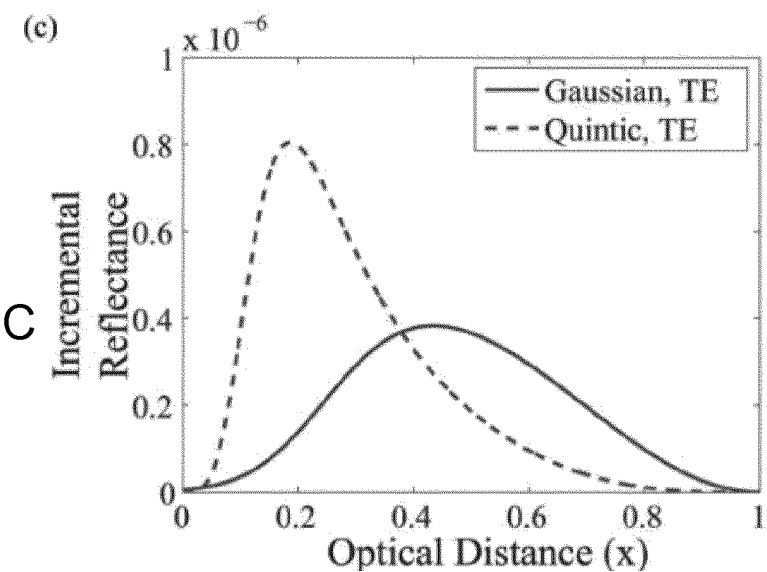
FIG. 11C shows reflectance within the Gaussian and Quintic coating at incident angle of $\theta_0=75$ degree.

Turning to FIG. 11A, results of Quintic and Gaussian profiles are presented as a function of optical distance. FIG. 11B shows the refractive angle within the Gaussian as well as Quintic profile as function of optical distance at $\theta=75°$, and FIG. 11C gives the incremental reflectance as a function of optical distance for the two profiles. The refractive angle $\theta$ in Quintic has a dramatic change at the front region whereas that of the Gaussian is relatively uniformly varied over the whole coating. Consequently, Quintic gains its top reflectance at about $x=0.18$ as shown in FIG. 11C while Gaussian has its top reflectance relatively close to the central point. In a nonstrict sense, the integration of reflectance over the whole coating indicates the total reflectance from the inhomogeneous profile. The reflectance under Quintic covers more area than that under Gaussian as demonstrated in FIG. 11C, showing that Gaussian may provides a better anti-reflection coating performance than Quintic. At a given coating thickness, the smoothness of the refractive angle may thus be used as a criterion in the synthesis of optimal gradient-index profile for wide-angle operation. Alternatively, given a pool of candidate profiles, the best one for large incident angles may be selected by comparing their respective refractive angle profiles.

B. Discretization

Further, the discretization of the continuous profiles and how it affects the overall performance are tested. Any suitable method for the discretization of the continuous profiles may be used, for example, the methods described by W. H. Southwell (W. H. Southwell, Appl. Opt. 24, 457-460, 1985), H. Sankur and his coworker (H. Sankur and W. H. Southwell, Appl. Opt. 23, 2770-2773, 1984), and J. Q. Xi, et al (J. Q. Xi, et al, Opt. Lett. 31, 601-603, 2006), which are hereby incorporated by reference in their entireties. A large range of arbitrary effective indexes may be realized in a layer of nanorods grown by glancing angle deposition (J.-Q. Xi, et al., Opt. Lett. 31, 601-603, 2006).

In this non-limiting embodiment, the refractive index and thickness of each layer are obtained by the following procedure: First, the refractive index is obtained by sampling the original profile at the center of a layer and with equal layer spacing ($\Delta x$); second, the thickness of each layer is obtained by performing the integration of Eq. (1), with limits from $-x/2$ to $x/2$, centering at the sample point.

Figure 12A:
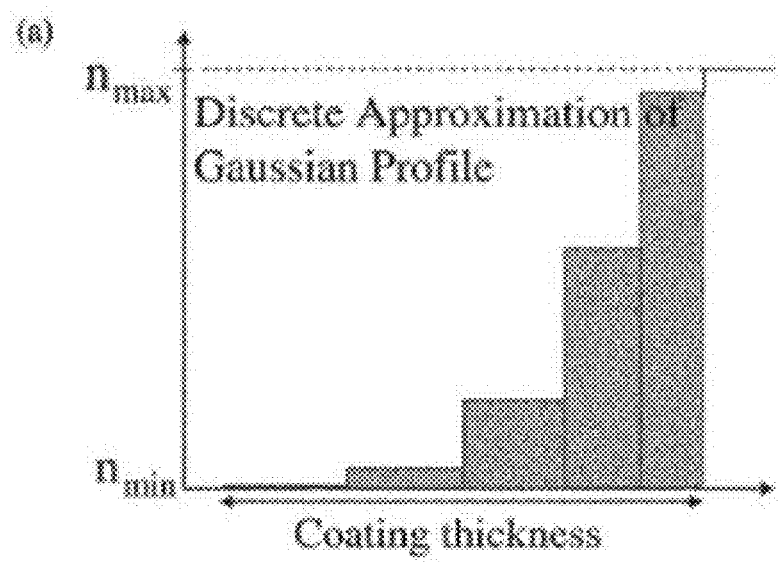
FIG. 12A shows a five-layer discretized Gaussian profile.
Figure 12B:
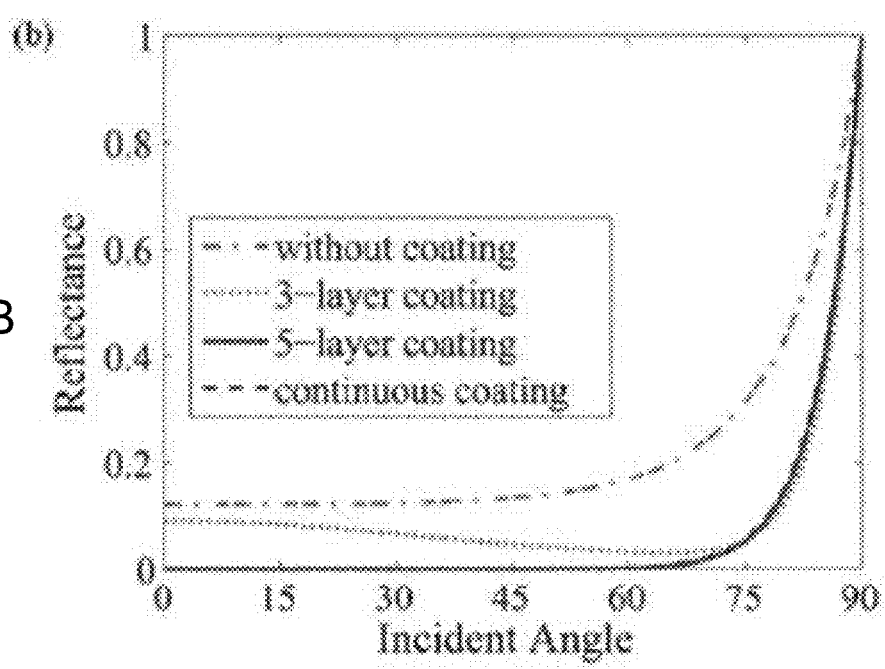
FIG. 12B shows an angular reflectance with respect to different numbers of discrete layers for a Gaussian profile.

FIG. 12A illustrates the geometry of an anti-reflection coating consisting of five laminar layers to approximate Gaussian profile. Note that the interference between both ends of each laminar layer is the same. FIG. 12B shows the calculated results with various numbers of layers. It can be seen that as few as five discrete homogeneous layers are sufficient for approximating Gaussian profile for anti-reflection coating between air and AlN with a good performance. Without wishing to be bound to a particular theory, the inventors believe that this result is a consequence of the fact that the fine structure is not resolvable under one-fifth of a wavelength with an index variation from 1 to 2.06. If increase the index variation is increased, more than five layers may be necessary to approximate the continuous profile.

In summary, this non-limiting embodiment shows that, at large incident angles, the magnitude of total reflection from a gradient-index film is mainly influenced by the smoothness of the optical path inside the film. The smoothness of the optical path can thus be used as a design criterion for omni-directional anti-reflection coating profile. This point of view can also be used to explain the performance difference between gradient-index profiles such as the Gaussian and Quintic. In addition, the Gaussian profile can be sufficiently approximated by as few as five discrete homogeneous layers for an anti-reflection coating between air and AlN. While AlN was used as an exemplary system, other substrate underlying materials may be used.

Embodiment III

To harness the full spectrum of solar energy, it favorable to eliminate Fresnel reflection at the surface of a solar cell over the entire solar spectrum. In this non-limiting embodiment, a multi-layer nanostructure having a graded index profile is designed (according to the theory described in Embodiment I above) and fabricated to obtain a near perfect transmission of all-color of sunlight. An ultra-low total reflectance of 1-6% has been achieved over a spectrum of $\lambda=400$ nm to 1600 nm, and over a range of angles-of-incidence of $\theta=0$-60 degrees. An angle- and wavelength-averaged total reflectance as low as 3.79% is achieved by using a seven layer graded-index coating. The corresponding solar-to-electric efficiency over an uncoated silicon wafer is consequently improved from 20.5% to 42.7% by going from a single-layer quarter-wave coating to a seven layer graded-index coating. This improvement of 22.2% makes such a multi-layer anti-reflection coating ideal for any class of solar cell application.

An anti-reflection coating is a type of coating applied to the surface of a material to reduce light reflection and to increase light transmission. The coating can improve solar collection efficiency and, therefore, the overall solar-to-electricity efficiency. As solar radiation is broadband, the anti-reflection coating needs to be effective over the entire solar spectrum from ultraviolet, visible to infrared wavelengths. To ensure high collection efficiency over the entire course of a day, the coating also has to be effective for all angles of light incidence, $\theta$. Hence, an ideal anti-reflection coating for solar application should maintain a low reflectance for all colors of sun light and all angles of incidence. For a smooth surface, the law of reflection is dictated by the Fresnel equation. It predicts a finite reflectance at normal incidence and a large reflectance at large $\theta$, except for those near the Brewster angle. This presents a fundamental constraint against the requirement of a low reflectance at all angles.

A single layer of quarter-wave anti-reflection coating can give zero reflection at a specific wavelength ($\lambda$) by a precise multiple interference of light within the layer. However, such a precise interference occurs only for a small $\lambda$-range and a small $\theta$-range. A double layer anti-reflection coating has also been proposed to extend the range of low reflectance regime from $\lambda$=~450 nm to 700 nm. An alternative approach to further increase the bandwidth is to create an artificially modified surface structure. For example, a periodic sub-$\lambda$ surface structure was shown to suppress Fresnel reflection in the visible and near-infrared at $\theta$=0 degree. However, there is no angular-dependent study of the reflectance except for $\lambda$=633 nm. It has been reported that a random silicon nanotip structure can give a total reflectance of less than 1% for $\lambda$=0.2-2.5 µm range. However, the claim of low reflectance remains controversial for $\lambda$>1.15 µm. This is because silicon is optically transparent for $\lambda$>1.15 µm and back reflection from the silicon substrate should give a greater than 30% reflectance in this wavelengths range. In general, while the process of random scattering can give a low total reflection over a large bandwidth, it is not as effective at large $\theta$. Thus, there is a need for a new anti-reflection coating scheme for solar applications.

As explained in Embodiment I, the final reflectance of such an anti-reflection coating depends on the smoothness of the index profile. Without wishing to be bound to a particular theory, the inventors believe that it is the differential reflectance at each interface of the multi-layer structure that one must minimize to obtain a low reflectance. As this minimization process does not depend strongly on $\lambda$ or $\theta$, the resulting structure may be an all-$\theta$ and all-$\lambda$ anti-reflection design in the solar spectrum regime. The all-$\theta$ and all-$\lambda$ aspects of the graded index nanostructure of this non-limiting embodiment make it an ideal candidate for anti-reflection coating for solar energy utilization. Theoretical modeling of several types of graded index profiles, including the Quintic and Gaussian profiles, has predicted a low reflectance for broad wavelength ranges. The Quintic profile has the following functional form: $n(z)=n_{min}+(n_{max}-n_{min})(10z^3-15z^4+6z^5)$. In this embodiment, $n_{min}$(air)=1, $n_{max}$(silicon)=3.6 and z refers to the vertical distance measured from the air/anti-reflection coating interface. Experimentally, a discrete set of layers having nanostructures was deposited to approximate the continuous index-profile. A low reflectance under all-$\lambda$ (400-1600 nm) and all-$\theta$ (0°-60°) is accomplished simultaneously on a silicon substrate. This performance is better than >98.5% transmission for $\lambda$=400-1000 nm and at $\theta$=0 to 30 degrees which is achieved on glass (n~1.45) substrate by Kennedy and his coworkers (Kennedy, S. R. and Brett, M. J., Applied Optics 2003, 42, 4573-4579).

Such a multi-layer anti-reflection coating may be prepared by any suitable deposition techniques, for example oblique angle deposition may be used to deposit one or more layers of the stack.

Briefly, the oblique angle deposition can produce slanted nanorods with a predesigned tilt angle and material porosity. A precise control of the porosity can lead to a controllable refractive index ranging from n=1.09-2.6, allowing the realization of almost any graded-index profile for solar collection. The details of the growth technique are described in Robbie et al. (Robbie, K et al., Nature 1996, 384, 616) and Zhao et al. (Zhao, Y. P. et al., Nano Letter 2002, 2, 351-354), which are hereby incorporated by reference in their entireties.

A scanning electron micrograph (SEM) image of the graded index anti-reflection coating sample and the refractive-indexes of each layer characterized by ellipsometry are shown in FIG. 3B. Particularly, the thicknesses of each layer, from bottom to top, are 69 nm, 78 nm, 81 nm, 101 nm, 113 nm, 145 nm, and 156 nm, respectively. The bottom two layers are made of $TiO_2$. The middle three layers are co-sputtered films using a combination of $SiO_2$ and $TiO_2$ to tailor the refractive index. The top two layers are made of slanted $SiO_2$ nanorods with very low refractive indexes of n=1.22 and 1.09, respectively. The slanted $SiO_2$ nanorods are randomly arranged, tilted along the same direction, have a typical diameter of 20-30 nm and a rod-to-rod spacing of 50-100 nm. This combination of the graded-index profile and the extremely low index of the $SiO_2$ slanted rods provides a low reflectance and high transmittance over the entire solar spectrum.

As explained previously in Embodiment I, FIG. 3A shows the calculated reflectance spectra at normal incidence ($\theta$=0°) for a bare silicon wafer, a $\lambda$/4 plate, and a graded index anti-reflection coating. In this calculation, it is assumed that the silicon substrate is infinitely thick and that there is no reflection from the bottom surface. First of all, the calculation shows that a bare silicon wafer has a reflectance of R=30-49% in this wavelength regime ($\lambda$=400-2000 nm). Second, the reflectance of a single-layer $\lambda$/4 coating is zero at $\lambda$=550 nm, but increases rapidly to R=27% at $\lambda$=2000 nm. Thirdly, the graded index anti-reflection coating is expected to have an overall reflectance of R=1%-6% throughout the solar spectrum.

To characterize the anti-reflection property of the graded-index coating, both total reflectance and diffuse reflectance are measured. The total reflectance measurement is used to account for all the reflected light. The diffuse reflectance measurement is used to evaluate the effect of random scattering of light, as the surface of the anti-reflection coating is not perfectly smooth.

The total reflectance measurements were performed for a broad range of (1) wavelengths, ($\lambda$=400-1600 nm) and (2) incident angles, ($\theta$=0-60°) as well as for both (3) the transverse electric (TE) and transverse magnetic (TM) polarizations of light. The total reflectance is measured using a commercially available integrating sphere, which integrates the reflected signal over all $4\pi$ of solid angles. A schematic of total reflectance measurement setup is shown in FIG.

13A. For the wavelength-dependent study, several lasers were used that include: λ=454-514 nm from an Argon laser, λ=633 nm from a He—Ne laser, and λ=780-1060 and λ=1260-1600 nm from laser diodes. To study the θ-dependence, the sample is mounted at the center of the sphere and the incident angle is varied by rotating the sample mount. The reflected light from the sample is collected by a calibrated silicon photodetector in the visible regime and an InGaAs detector in the near infrared regime.

Figures 13A, 13B, 13C:
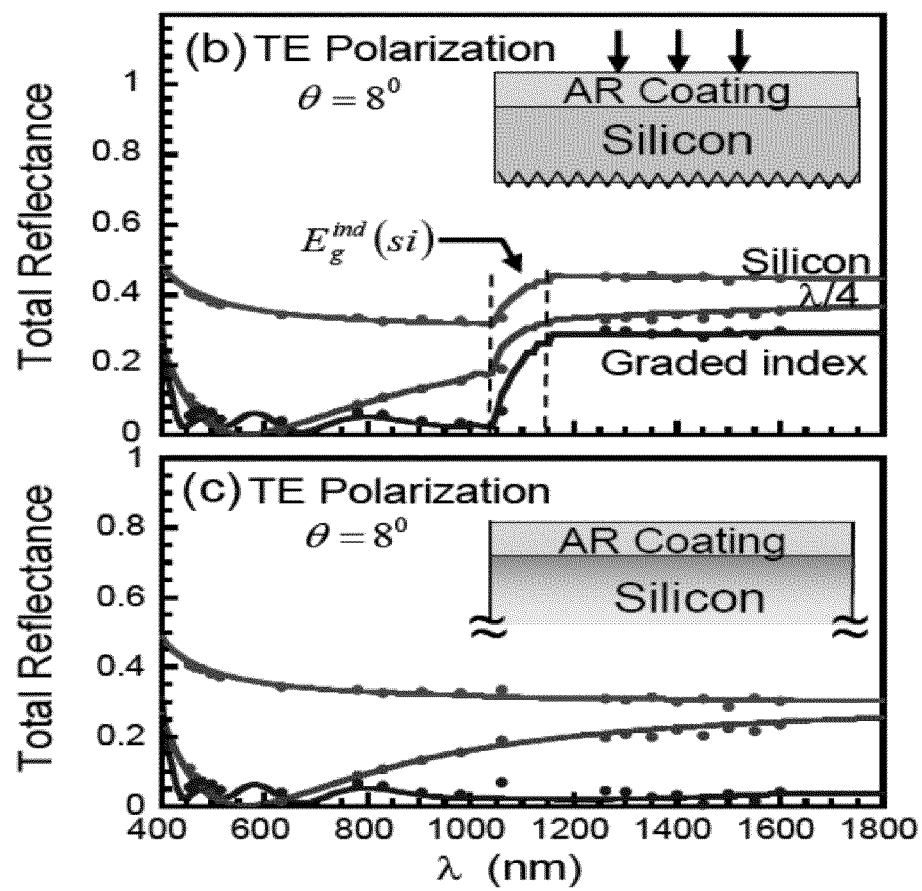
FIG. 13A shows a schematic drawing of a setup used to measure total reflectance.
FIG. 13B shows total reflectance at θ=8 degree as a function of wavelength, of (i) bare silicon, (ii) λ/4 layer, and (iii) graded-index samples, respectively. Light is TE-polarized. The dots refer to data points measured and the curves refer to calculated results of a sample structure shown in the inset. The sharp rise of reflectance at λ~1150 nm, where silicon's indirect band occurs, is due to an added reflection from the bottom of the silicon substrate.
FIG. 13C shows a deducted total reflectance data (solid dots) from the top anti-reflection coating surface only. This data demonstrates a low total reflection (R=1-6%) over an ultra broad wavelength range, λ=400-1600 nm, at small incident angle, using the graded-index anti-reflection coating.

FIG. 13B shows the measured total reflectance spectra (the solid dots) of the bare silicon, the λ/4, and the graded-index samples, respectively. Light is incident at θ=8° and is TE polarized. The curves are from a theoretical calculation that accounts for the finite thickness of silicon substrate and its slightly rough back surface. In the λ=400-1100 nm range, all three samples exhibit similar reflectance behavior to those predicted in FIG. 3A. In brief, the silicon has a high reflectance of R~31-49%, the λ/4 has a minimum reflectance at λ=550 nm and, finally, the graded index sample has a low reflectance of R~5%. However, all three samples exhibit an abrupt increase in their reflectance at λ~1150 nm indicated by the vertical dashed lines. This sharp rise of reflectance may be attributed to the onset of silicon's optical transparency at λ~1150 nm, where silicon's indirect band gap occurs. In these wavelengths, the portion of light passing through the anti-reflection coating is barely absorbed by silicon and would be reflected from the back surface of the silicon substrate.

Assuming that the silicon substrate has no absorption in this regime λ>1150 nm and the backside silicon-air interface is an optical flat surface with an effective index ($n_{eff}$) and an infinite thickness, so-called plane-wave based Transfer-Matrix Method (Li, Z. Y. et al., Phys. Rev. E 2003, 67, 46607) is used for a model fit. Both the thickness and the index-of-refraction of the multi-layer structure may be used as input parameters. The model fit uses $n_{eff}$ as a single fitting parameter. The model (the solid curves) fit the data well and yield $n_{eff}$=1.09, 1.35, 1.09 for the backside of the silicon, λ/4 and graded-index anti-reflection coating samples, respectively. Without wishing to be bound to a particular theory, the inventors believe that the satisfactory fitting indicates that the reflectance for λ>1150 nm comes from two contributions: one from the top surface and the other from the bottom surface. Furthermore, once the $n_{eff}$ of the bottom surface is known, it is possible to separate the contribution from the back side surface and obtain reflectance due only to the anti-reflection coating.

The deduced experimental reflectance data (solid dots) from the top surface are plotted in FIG. 13C, for silicon, λ/4 and graded index samples, respectively. The silicon reflectance decreases monotonically as k is increased due to a slight decrease in silicon's refractive index. The λ/4 anti-reflection coating has super low total reflectance of R<3% for a small bandwidth, λ=550±50 nm. However, beyond this λ-range, reflectance increases rapidly and exhibits a strong wavelength dependence. For the graded-index anti-reflection coating, the total reflectance remains low, R=1-6%, for all visible and near infrared wavelengths. It is noted that the theoretical fits (the solid curves) in FIG. 13C are computed by assuming that the substrate is infinite to eliminate the contribution from backside reflection. The fitted result agrees well with the experimental data for all-λ, except for λ=1050 nm, where silicon begins to become transparent. It is unexpected and remarkable that the theoretical curve of the graded index sample reproduces the weak reflectance oscillations between λ=450-1000 nm. This data is believed to represent the first successful demonstration of an all-wavelength (λ=400-1600 nm) anti-reflection coating at small incident angle, having an ultralow reflection (R=1-6%) for solar applications.

Next, the all-θ aspect of the seven-layer graded index anti-reflection coating is demonstrated while the broadband nature of the low-reflectance coating is obtained simultaneously. As shown in the insert of FIG. 4A, laser light is incident at an angle θ, and the reflected signal is detected at a different angle φ. The detector used has a collecting solid angle of ΔΩ=8.2×10$^{-4}$ steradian. In FIG. 4A, the measured reflectance for TE polarization at λ=633 nm is plotted as a function of φ from −80° to 80° for five different θ. First of all, the data exhibits a δ-function-like sharp reflection peak at |φ|=|θ| and a slight diffused component with $R_{diffu}$≤10$^{-4}$-10$^{-7}$. In contrast to conventional random surface structures, the nanorod structure used in this embodiment is dominated by specular reflection. Without wishing to be bound to a particular theory, the inventors believe that this is because even though the $SiO_2$ nanorods may be randomly arranged, the surface is optically smooth to within ~$\frac{1}{10}$λ. Second, the peak reflectance for TE polarization for θ shows an initial decrease, reaches a minimum value of 2% at θ=−40°, and finally increases to 9% at θ=−60°. This unusual angular dependence does not follow the Fresnel equation and is a new feature of the anti-reflection coating. Thirdly, the diffuse reflectance may be modeled using an exponential scatter profile:

$$PSD = \frac{\sigma_{rms}^2 T^2}{\pi^2} \frac{1}{1+k^2 T^2 A^2}$$

(Ogilvy, J. A., Theory of Wave Scattering from Random Rough Surface, 1990, 17-19). Here, $\sigma_{rms}$ is the root mean square of the diffuser height and T is the correlation length of the random surface. The model fits the diffused part of the measured reflectance well and is shown in FIG. 4A as the dashed curves. The percentage of diffuse reflectance as compared to the total reflectance: 1.88%, 2.0%, 1.76%, 1.32%, and 0.765% at θ=−10°, −30°, −40°, −50°, −60°, respectively, can be obtained from the fit results. The data measured at λ=633 nm show that the graded-index anti-reflection coating can simultaneously accomplish a low total reflectance and a weak diffuse reflectance under a wide range of θ.

This unique feature of low reflectance for all-θ at λ=633 nm applies equally well to other wavelengths. In FIG. 4B, the measured (dots) and calculated (curves) total reflectance of the graded-index sample vs θ for λ=633 nm (top), 830 nm (middle), and 904 nm (bottom), respectively, are presented. TE polarized light is used. For comparison purpose, total reflectance of a λ/4 anti-reflection coating is also shown. At λ=633 nm, both the graded index and λ/4 sample exhibit a similarly low reflectance at θ=8° and a reasonable reflectance of R~10% at θ=60°. At λ=830 nm, the total reflectance of the graded-index sample remains low (R=2-5%) for all-θ. On the contrary, the total reflectance of a λ/4 sample becomes quite high, i.e. R=11% at θ=80° and R=26% at θ=60°. At an even longer wavelength of λ=904 nm, the graded-index sample still maintains its low reflectance, while that for the λ/4 anti-reflection coating is as high as R=13-33%. Same measurements were repeated for TM polarized light, and the data for the graded-index sample shows a similar low reflectance at all-θ and all-λ, demonstrating a superior all-θ and all-λ aspect of the graded-index anti-reflection coating.

Further, the performance of the graded-index anti-reflection coating is compared with that of a conventional single-layer λ/4 coating using the angle-averaged and λ-averaged total reflectance. To give an average value of the total reflectance, the reflectivity function R(λ,θ) is integrated over all measured angles from θ=8° to 60° and over all-λ from λ=400 nm to 2000 nm. The angle-averaged total reflectance is defined using the following formula:

$$R_{angle\text{-}avg}(\lambda) = \frac{\int_8^{60} R(\theta, \lambda) d\theta}{\int_8^{60} d\theta}.$$

The range used for incident angles in this particular example is limited by the testing system setup. As the laser beam spot is much smaller than the sample size, there is no need to include a cos(θ) term in the integration to account for the angular-dependence of the incident light intensity.

Turning to FIG. 5A, both the measured and calculated $R_{angle\text{-}avg}$ are presented as a function of λ for TE-polarization. Again, results of the TMM calculation simulate the measured data well. Compared to the λ/4 coatings (the dots and curve), the graded-index coating exhibits a much lower $R_{angle\text{-}avg}$ (λ) for the entire λ-range and is also nearly λ-independent. As shown in FIG. 5B, $R_{angle\text{-}avg}$ (λ) for TM-polarization exhibits a very similar functional dependence as that for the TM polarization. For the bare silicon, the overall $R_{angle\text{-}avg}$ (λ) is lower for TM than that for TE polarization, possibly due to the occurrence of the Brewster angle for TM. Again, the $R_{angle\text{-}avg}$ (λ) value of the graded-index coating is significantly lower that of the λ/4 coatings and is also nearly λ-independent.

Finally, the average total reflectance is calculated by integrating the fitted data, $R_{angle\text{-}avg}$ (λ), from λ=400 nm to 2000 nm for both polarizations shown in FIGS. 5A and 5B, respectively. The results are summarized in Table 1. The average total reflectance over all angles, wavelengths of the bare silicon, λ/4 coating and graded-index coating are 32.6%, 18.8% and 3.79%, respectively. By conservation of energy, the total transmission efficiency of light and the total reflectance are related by: $T_{Total}=1-R_{Total}$. Hence, the use of an graded-index and λ/4 coating can achieve solar collection efficiency (from λ=400-2000 nm) of 81.2 and 96.21%, respectively. It illustrates that optical-to-electrical power conversion efficiency increases by 22.2% when switching from a conventional single-layer λ/4 anti-reflection coating to a seven layer graded index anti-reflection coating. The graded index profile may also be tailored, when applied to solar cells based on other materials, such as III-V multi junction and CdTe, according to the refractive index of a specific material.

TABLE 1

θ- and λ-Averaged Total Reflectance and Efficiency of AR Coating for Silicon, Single-Layer λ/4 Coating, and Graded-Index Coating Samples

|  | $R_{avg}$ (%) | η of AR Coating (%) | Improved η over Silicon (%) |
| --- | --- | --- | --- |
| Silicon | 32.6 | 67.4 | |
| Single layer | 18.8 | 81.2 | 20.5 |
| Graded index | 3.79 | 96.21 | 42.7 |

In summary, this embodiment demonstrates a multi-layer nanostructure anti-reflection coating that can be engineered to significantly reduce optical reflection over all wavelengths of sun light and incident angles. This graded-index approach offers a mechanism for minimizing Fresnel reflection fundamentally different from either the traditional λ/4 anti-reflection coating or the modified surface structures. The new design freedom afforded by this graded index coating and the deposition technique of oblique angle deposition technique allows the creation of this all-θ, all-λ anti-reflection coating. This non-limiting embodiment may improve the solar-to-electrical conversion efficiency by 22.2% compared to a conventional system using a conventional single-layer λ/4.

Embodiment IV

Minimizing optical reflection at dielectric interfaces is a fundamental challenge, and is vital for many applications in optics. It is well known that normal-incidence reflection at a specific wavelength can be minimized using a single layer coating with quarter-wavelength optical thickness and refractive index $n=\sqrt{n_1 n_2}$, where $n_1$ and $n_2$ are the refractive indices of the ambient and substrate, respectively. However, a material with the required refractive index may not exist, and additionally, omni-directional and broadband anti-reflection characteristics are often required for applications such as solar cells or image sensors.

Several methods exist that allow the tuning of refractive index for optical thin films. Alternating layers of a high-index and low-index material, each with thickness much less than the wavelength, produces a film that can be treated as homogenous with refractive index approximated by the volume ratio of the two constituent materials (W. H. Southwell, Appl. Opt. 24, 457-460, 1985). By changing the relative thickness of each layer, the effective refractive index of the film can be varied between that of the two materials. Oblique angle deposition can also be used to control the refractive index; in oblique angle deposition, self-shadowing results in the formation of a nano-porous film of high optical quality. The refractive index is related to the porosity of the film, and can be varied by changing the deposition angle. At deposition angles close to 90°, the porosity becomes large and the index decreases to low values. The nano-porous material is termed low-refractive-index (low-n) material. Using $SiO_2$, refractive indices as low as 1.05 have been reported. A third method to create a film with specific refractive index is co-sputtering, in which two materials such as $SiO_2$ and $TiO_2$ are simultaneously deposited. The refractive index can be tuned by varying the relative deposition rates of the two materials.

The ability to tune the refractive index is important in enabling broadband and omni-directional anti-reflection coatings. Such coatings generally consist of multilayer stacks in which the refractive index is graded between substrate value and that of air. Using the appropriate refractive index is important in achieving the best performance. In addition, the inclusion of layers with refractive index close to that of air can greatly reduce reflection. Well-known refractive index profiles for anti-reflection coatings include the Quintic or modified-Quintic profiles, which are continuous functions that vary between the substrate refractive index and the index of the ambient material.

However, these profiles sometimes do not give the optimum profile when a finite number of layers is used. Additionally, these profiles require high-refractive-index transparent materials—which often do not exist—to be matched to high-refractive-index substrates, such as silicon. Finally, material dispersion is not considered although it may play a significant role, particularly for broadband applications.

Optimization of multilayer anti-reflection coatings is difficult because of the high cost of evaluating the performance for a given structure. In addition, the parameter space generally includes many local minima, which makes deterministic optimization schemes that find the local minima unsuitable (H. Greiner, *Appl. Opt.* 35, 5477-5483, 1996). To meet these challenges, genetic algorithms have previously been applied in order to optimize a variety of optical coatings, for example genetic algorithms disclosed by H. Greiner (H. Greiner, *Appl. Opt.* 35, 5477-5483, 1996), S. Martin et al. (S. Martin, et al., *Opt. Commun.* 110, 503-506, 1994 and *Appl. Opt.* 34, 2247-2254, 1995), and J.-M. Yang et al. (J. M. Yang et al., *J. Light. Technol.* 19, 559-570, 2001), which are hereby incorporated by reference in their entireties. Genetic algorithms mirror biological evolution in which the fitness of a population is increased by the processes of selection, crossover, and mutation. In this embodiment, genetic algorithm is applied to optimize anti-reflection coatings for silicon image sensors, silicon solar cells, and triple junction Ge/GaAs/GaInP solar cells with air as the ambient medium. The calculations consider coatings composed of co-sputtered and low-n materials and take material dispersion into account.

A. Numerical Approach

Calculations begin with the generation of a population of anti-reflection coatings with a fixed number of layers whose thicknesses and compositions are randomly generated. A layer may be composed of either nano-porous $SiO_2$ or any combination of $SiO_2/TiO_2$, corresponding to low-n and co-sputtered films, respectively. The porosity of $SiO_2$ may be up to 90%, corresponding to a refractive index of 1.05, which has previously been demonstrated. For each member of the population, the largest thicknesses can be matched to compositions with the lowest refractive index, and then sorted so that the high-index layers are adjacent to the substrate. This increases the population near the optimum anti-reflection coating—which may have monotonically decreasing refractive index and increasing thickness when moving away from the substrate—and reduces the computation time.

After the population has been formed, the fitness of each member may be evaluated. The fitness may be determined by the reflection coefficient averaged over the wavelength range and angle range of interest, $R_{ave}$, which is given by, $$R_{ave} = \frac{1}{\lambda_2 - \lambda_1} \frac{2}{\pi} \int_{\lambda_1}^{\lambda_2} \int_0^{\pi/2} \frac{R_{TE}(\lambda, \theta) + R_{TM}(\lambda, \theta)}{2} d\theta d\lambda \quad (1)$$

where $R_{TE}$ and $R_{TM}$ are the TE and TM reflection coefficients. In practice, the fitness function may easily be modified to give greater weight to certain angles of incidence or to certain wavelengths to take into account the responsivity of a particular solar cell, the solar spectrum, or the orientation of a solar cell with respect to the sun, in order to maximize the power produced by a solar cell, for example. The fittest member of the population is the one with lowest average reflection coefficient. The method for calculating the reflection coefficients of a multilayer stack was described by Born and Wolf (M. Born and E. Wolf, *Principles of Optics*, Pergamon, Oxford. 1980), which is hereby incorporated by reference in its entirety. The population may be sorted by fitness, and a percentage of the worst members are then discarded. These are replaced by the offspring of two other anti-reflection coatings, which are selected at random from the remaining members of the population. Offspring anti-reflection coatings are generated by a process of crossover and mutation. In crossover, a set of layers for the new offspring is taken from one parent, and the remainder is taken from the second parent. In mutation, the composition and thickness of each layer is given a random perturbation. Once the worst members of the population have been replaced by new offspring, the fitness of each is evaluated, and the process repeats until good convergence is achieved. Finally, using a deterministic algorithm, the local minima near the fittest member of the population is found.

B. Silicon Image Sensor

Silicon image sensors are widespread in digital cameras, and generally capture light in the visible wavelength range. Low reflection from the sensor surface is desirable to increase the absorbed light and decrease the noise in the resultant image. The reflection coefficient should also be low over a wide range of incident angles; depending upon lens configuration, the angle of incidence of light on the sensor surface can vary. Strong angular dependence of reflection can produce undesirable vignetting. Finally, the reflection coefficient must be consistently low across the entire visible wavelength range of 400 to 700 nm.

Figure 14:
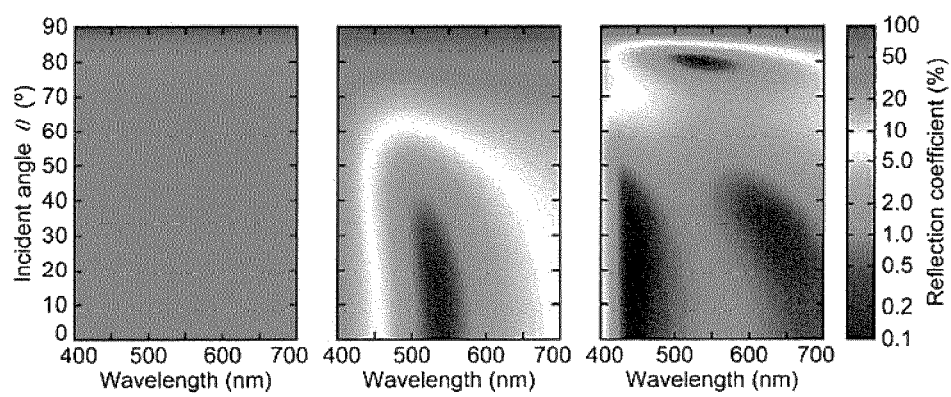
FIG. 14 shows reflection coefficient of (left) silicon, optimized (center) one-, and (right) three-layer anti-reflection coatings for silicon image sensors versus wavelength and incident angle.

Several layer compositions and thicknesses of these optimized coatings are tested and listed in Table 2. Layer thicknesses and compositions should be within several percent of the specified values in order to achieve performance similar to the given structure. FIG. 14 shows the reflection coefficient of (left) silicon, optimized (center) one-, and (right) three-layer anti-reflection coatings as a function of wavelength and incident angle. The reflection for bare silicon is high throughout the range of wavelengths and angles. The single-layer coating has a minimum near $\lambda=540$ nm at small angles of incidence, where the reflection coefficient is below 0.5%, and reduced reflection coefficient values throughout the range compared to bare silicon.

Without wishing to be bound to a particular theory, the inventors believe that the three-layer coating has three distinct minima that combine to give reflection coefficients less than 2% for the majority of wavelengths and incident angles. In some embodiments, the number of local minima in reflection is equal to the number of layers used in an optimized anti-reflection coatings for the silicon image sensor, and about half of the layers are composed of nano-porous low-n $SiO_2$. Similar rules may be used for optimizing anti-reflection coatings for other applications, which will be shown below. This finding underscores the importance of low-n materials in achieving high performance anti-reflection coatings.

Figure 15:
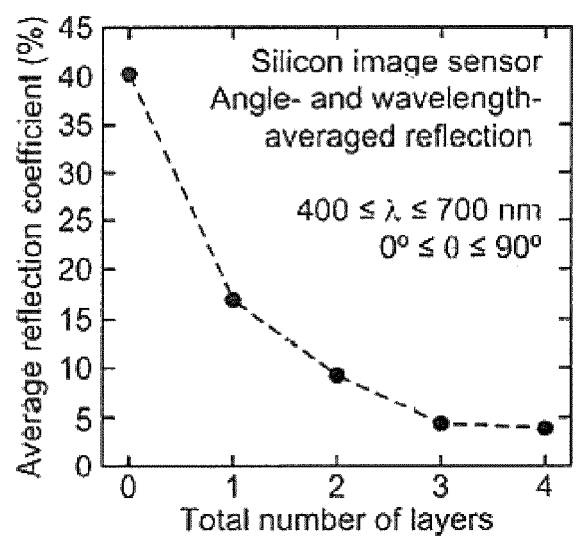
FIG. 15 shows angle- and wavelength-averaged reflection coefficient as a function of the number of layers for optimized anti-reflection coatings for a silicon image sensor.

The reflection coefficient as a function of layer number for optimized coatings is shown in FIG. 15. The reflection coefficient initially decreases rapidly as more layers are added, and then becomes almost constant. The angle- and wavelength-averaged reflectivity of the three- and four-layer anti-reflection coatings are similar at 4.9% and 4.4%, respectively; the top layers of the three- and four-layer anti-reflection coatings each are composed of 90% porous $SiO_2$ having the lowest allowed refractive index, while the bottom layers of both coatings are pure or nearly-pure $TiO_2$ having the highest achievable refractive index. As mentioned above, the three- and four-layer coatings have similar reflection coefficients. Without wishing to be bound to a particular theory, the inventors believe that this is a general characteristic for anti-reflection coatings: once a sufficient number of layers is used so that the optimum stack contains layers with both the highest and lowest allowed refractive index, increasing the layer number further has only a small effect on the reflection coefficient. In Tables 2-4, "CS" refers to a co-sputtered layer, and the percentage of a CS layer refers to a weight percentage of the particular material composed of in the CS layer. For example, "CS, 42% TiO$_2$" refers to a co-sputtered layer containing 42% TiO$_2$ and 58% SiO$_2$. "NP" refers to a nano-porous low-n layer such as a nanorod layer, and the percentage of a NP layer refers to one minus the porosity of the layer. For example, "NP, 10% SiO$_2$" refers to a nanoporous layer having a porosity of 90%.

TABLE 2

Thickness t (in nm) and composition c of individual layers for optimized silicon image sensor anti-reflection coatings.

|  | 1-layer | 2-layer | 3-layer | 4-layer |
| --- | --- | --- | --- | --- |
| $t_1$ | 68.4 | 327.7 | 362.8 | 293.4 |
| $t_2$ | — | 65.6 | 91.9 | 115.6 |
| $t_3$ | — | — | 42.7 | 75.4 |
| $t_4$ | — | — | — | 41.7 |

TABLE 2-continued

Thickness t (in nm) and composition c of individual layers for optimized silicon image sensor anti-reflection coatings.

|  | 1-layer | 2-layer | 3-layer | 4-layer |
| --- | --- | --- | --- | --- |
| $c_1$ | CS, 36% TiO$_2$ | NP, 14%, SiO$_2$ | NP, 10% SiO$_2$ | NP, 10% SiO$_2$ |
| $c_2$ | — | CS, 42% TiO$_2$ | CS, 4% TiO$_2$ | NP, 35% SiO$_2$ |
| $c_3$ | — | — | CS, 98% TiO$_2$ | CS, 15% TiO$_2$ |
| $c_4$ | — | — | — | CS, 100% TiO$_2$ |

C. Silicon Solar Cell

Figure 16:
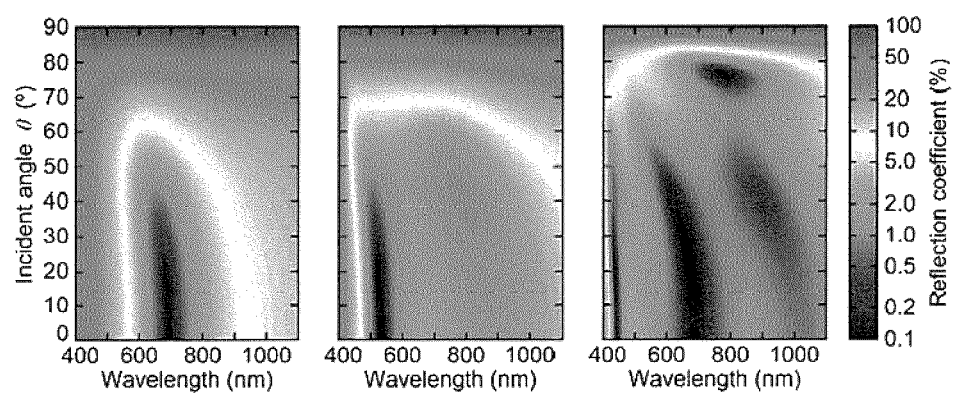
FIG. 16 shows reflection coefficient of (left) one-, (center) two- and (right) four-layer anti-reflection coatings optimized for silicon solar cells versus wavelength and incident angle.

The silicon solar cell is one of the most widespread technologies for photovoltaics with a relevant spectral range of 400 to 1100 nm. One or two-layer anti-reflection coatings and surface texturing are common methods used to reduce reflection from the surface and increase efficiency. Using the genetic algorithm approach disclosed above, anti-reflection coatings for silicon solar cells with up to five layers with optimized performance can be obtained. The reflection coefficient as a function of wavelength and incident angle is shown in FIG. 16 for optimized one-, two-, and four-layer anti-reflection coatings. As before, the number of minima in reflection is equal to the number of layers in the anti-reflection coating. The compositions of optimized coatings are shown in Table 3. Again, nano-porous layers compose roughly half of the layers in an anti-reflection coating with a given number of layers.

Figure 17:
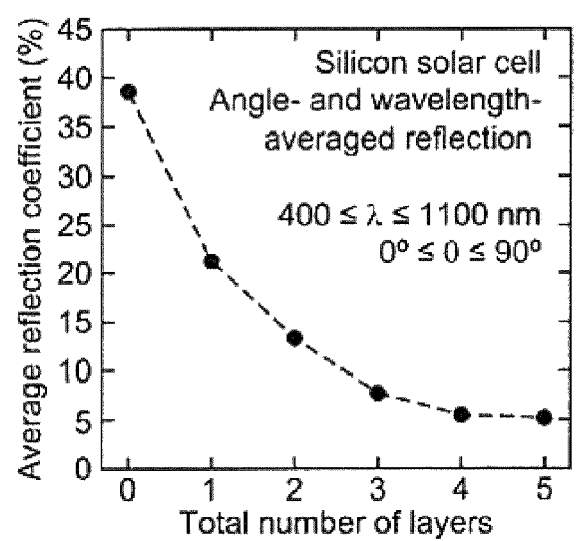
FIG. 17 shows angle- and wavelength-averaged reflection coefficient as a function of the number of layers for optimized anti-reflection coatings for silicon solar cells.

Compared to the one- and two-layer coatings, the four-layer coating yields substantially reduced reflection, particularly at the largest incident angles and shortest wavelengths. Note that the one- and two-layer coatings feature one co-sputtered layer and both nano-porous low-n and co-sputtered layers, respectively, resulting in enhanced performance compared to conventional one- and two-layer coatings. The angle- and wavelength-averaged reflection coefficients are plotted in FIG. 17 as a function of the number of layers. As discussed above, when an optimized anti-reflection coating includes layers with both the lowest allowed and highest allowed refractive index, adding additional layers generally may not provide significant benefit. In the case of the silicon solar cell, which is identical to the image sensor with the exception that the relevant wavelength range is broader, a larger number of layers may be needed to reach the threshold. In the image sensor, switching from three to four layers reduces average reflectivity by 10.5%, while for the solar cell, such a switch reduces the average reflectivity by 29.4%. Adding a fifth layer to the solar cell anti-reflection coating may further reduce the reflectivity by an additional 5.6%.

TABLE 3

Thickness t (in nm) and composition c of individual layers for optimized silicon solar cell anti-reflection coatings.

|  | 1-layer | 2-layer | 3-layer | 4-layer | 5-layer |
| --- | --- | --- | --- | --- | --- |
| $t_1$ | 91.2 | 133.1 | 432.8 | 432.6 | 388.7 |
| $t_2$ | — | 64.0 | 113.3 | 145.8 | 159.3 |
| $t_3$ | — | — | 58.6 | 79.7 | 107.8 |
| $t_4$ | — | — | — | 51.2 | 70.1 |
| $t_5$ | — | — | — | — | 50.5 |
| $c_1$ | CS, 36% TiO$_2$ | NP, 78% SiO$_2$ | NP, 11% SiO$_2$ | NP, 10% SiO$_2$ | NP, 10% SiO$_2$ |
| $c_2$ | CS, 36% TiO$_2$ | CS 70% TiO$_2$ | CS, 3% TiO$_2$ | NP, 54% SiO$_2$ | NP, 29% SiO$_2$ |
| $c_3$ | — | — | CS, 82% TiO$_2$ | CS, 28% TiO$_2$ | NP, 81% SiO$_2$ |
| $c_4$ | — | — | — | CS, 100% TiO$_2$ | CS, 37% TiO$_2$ |
| $c_5$ | — | — | — | — | CS, 100% TiO$_2$ |

D. GaInP/GaAs/Ge Triple-Junction Solar Cell

Multi junction solar cells have achieved the highest efficiency of any photovoltaic technology available, for example the technologies disclosed in N. H. Karam, et al. (N. H. Karam, et al., *Sol. Energy Mater. Sol. Cells* 66, 453-466, 2001), D. J, Friedman et al. (D. J, Friedman et al., *Prog. Photovolt: Res. Appl.* 9, 179-189, 2001), and Z. Q. Li, et al. (Z. Q. Li, et al., *Proc. SPIE* 6339, 633909, 2006), which are hereby incorporated by reference in their entireties. Because of the high cost associated with fabrication, a primary intended use is in concentrator systems, where lenses or reflectors are used to collect sunlight over a large area and focus it on a small active area where the solar cell is located. Generally, there is always some light incident upon the solar cell at oblique angles because of the nature of concentrator systems, making broadband and omni-directional anti-reflection coatings especially important in this application.

Figure 18:
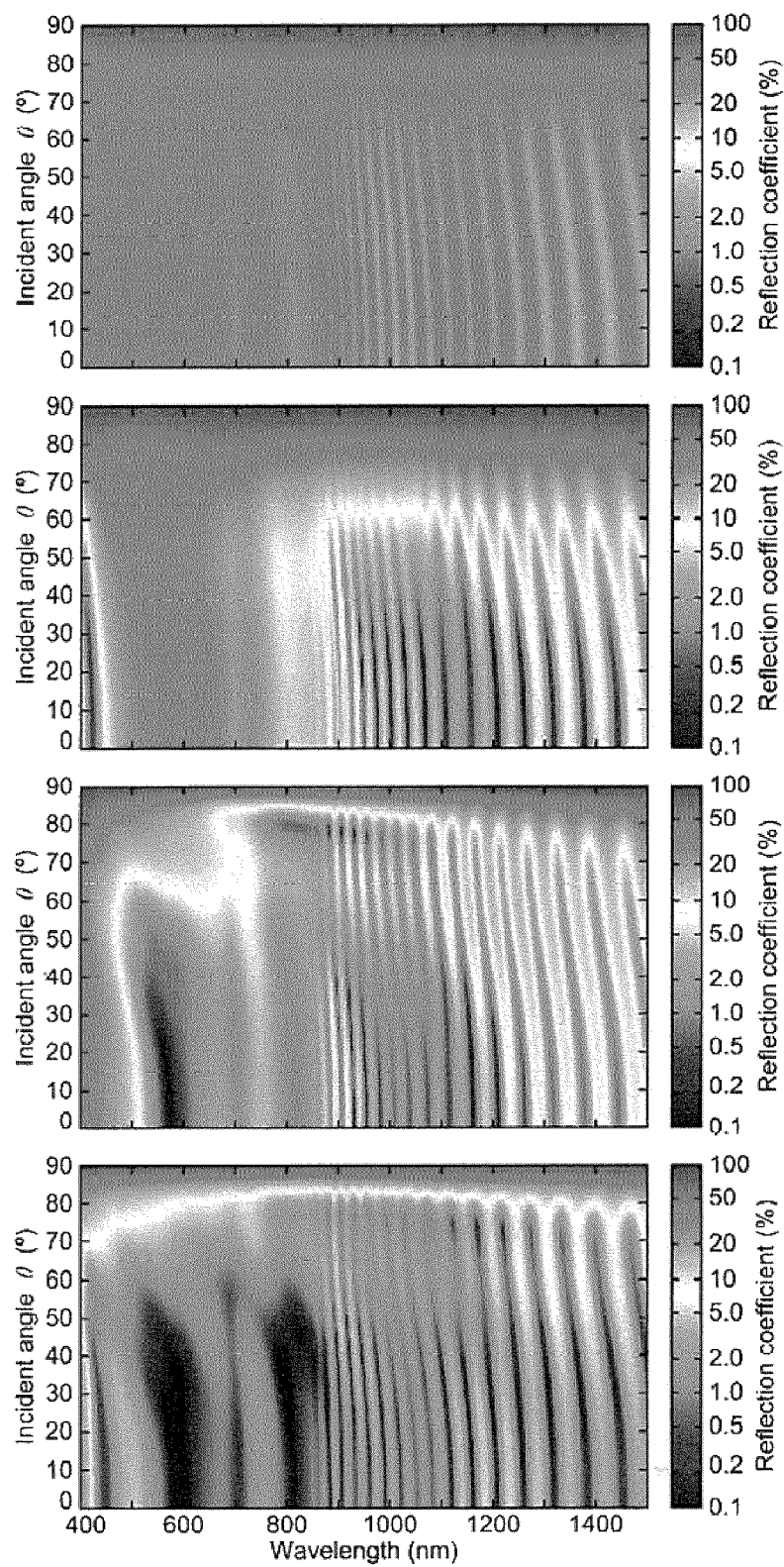
FIG. 18 shows reflectivity of (top to bottom) a bare GaInP/GaAs/Ge triple-junction solar cell, and triple-junction solar cells with optimized one-, three-, and five-layer anti-reflection coatings.

The structure used in calculations consists of a GaInP/GaAs/Ge stack with thicknesses is described in Z. Q. Li, et al. (Z. Q. Li, et al., *Proc. SPIE* 6339, 633909, 2006), which is hereby incorporated by reference in its entirety. The bottom germanium layer is assumed to be infinitely thick. The structure used includes intermediate layers which act as tunnel junctions or back surface field structures, however, the refractive indices of materials used in some of these layers are not well reported. Therefore, the triple-junction solar cell is treated as a simple three-layer stack, although, in principle, any number of layers could be included in the calculation. The wavelength range considered in for the anti-reflection coatings is 400 nm to 1500 nm. Table 4 shows the composition and thickness of each layer for optimized anti-reflection coatings with up to six layers. FIG. 18 shows the reflectivity as a function of angle for the bare triple-junction solar cell, as well as the solar cell with optimized one-, three-, and five-layer anti-reflection coatings.

TABLE 4

Thickness t (in nm) and composition c of individual layers for optimized GaInP/GaAs/Ge triple junction solar cell anti-reflecton coatings.

|  | 1-layer | 2-layer | 3-layer | 4-layer | 5-layer | 6-layer |
| --- | --- | --- | --- | --- | --- | --- |
| $t_1$ | 162.7 | 294.9 | 544.4 | 550.9 | 525.0 | 489.8 |
| $t_2$ | — | 132.0 | 137.5 | 168.1 | 195.8 | 206.5 |
| $t_3$ | — | — | 78.3 | 94.0 | 108.9 | 127.7 |
| $t_4$ | — | — | — | 63.0 | 74.1 | 90.1 |
| $t_5$ | — | — | — | — | 53.2 | 66.5 |
| $t_6$ | — | — | — | — | — | 52.2 |
| $c_1$ | CS, 27% $TiO_2$ | NP, 36% $SiO_2$ | NP, 11% $SiO_2$ | NP, 10% $SiO_2$ | NP, 10% $SiO_2$ | NP, 10% $SiO_2$ |
| $c_2$ | — | CS, 44% $TiO_2$ | CS, 0% $TiO_2$ | NP, 58% $SiO_2$ | NP, 39% $SiO_2$ | NP, 28% $SiO_2$ |
| $c_3$ | — | — | CS, 61% $TiO_2$ | CS, 25% $TiO_2$ | CS, 5% $TiO_2$ | NP, 69% $SiO_2$ |
| $c_4$ | — | — | — | CS, 82% $TiO_2$ | CS, 48% $TiO_2$ | CS, 17% $TiO_2$ |
| $c_5$ | — | — | — | — | CS, 100% $TiO_2$ | CS, 57% $TiO2$ |
| $c_6$ | — | — | — | — | — | CS, 100% $TiO_2$ |

Figure 19:
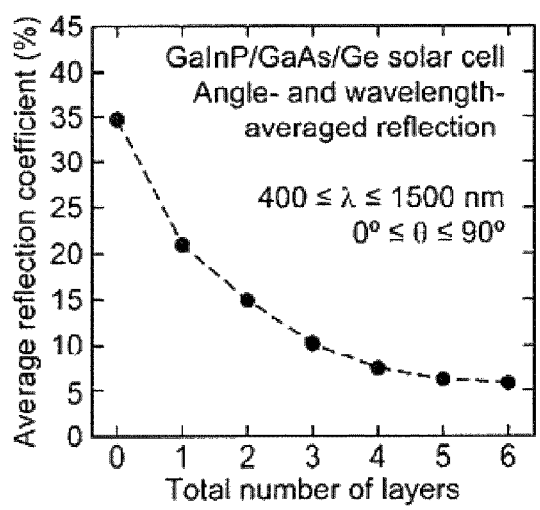
FIG. 19 shows angle- and wavelength-averaged reflection coefficient as a function of the number of layers for optimized anti-reflection coatings for GaInP/GaAs/Ge triple-junction solar cells.

As shown in FIG. 18, the reflectivity at wavelengths longer than 700 nm, and particularly longer than 900 nm shows pronounced fringing. Without wishing to be bound to a particular theory, the inventors believe that these longer wavelengths pass through the top junction or both the top and middle junctions of the solar cell without being absorbed; interference of light within these layers produces the reflectivity fringes. When a single-layer anti-reflection coating is added, reflectivity is initially reduced at longer wavelengths. As more layers are added, reflectivity across the entire range of wavelengths and incident angles is reduced. FIG. 19 plots the reflectivity of the optimized anti-reflection coatings as a function of total number of layers.

In summary, this non-limiting embodiment describes a method for optimizing anti-reflection coatings made of co-sputtered and nano-porous low-refractive-index coatings. The method is based on a genetic algorithm which is well suited for the task of optimizing optical thin-film coatings, given the fact that the design space of multi-layered optical coatings includes many local minima of the fitness function, i.e., the average reflectivity. In this non-limiting embodiment, the optimization method is applied to silicon image sensors and solar cells, as well as a triple junction GaInP/GaAs/Ge solar cell, but this optimization method may be applied to any other suitable systems such as light-emitting diodes or other optical components/devices that interfacial Fresnel reflections are undesirable. As described above, in some embodiments, nanoporous layers constitute roughly half of the total number of layers in optimized anti-reflection coatings, which underscores the importance of low-refractive-index materials for high-performance anti-reflection coatings.

Embodiment V

Figure 20:
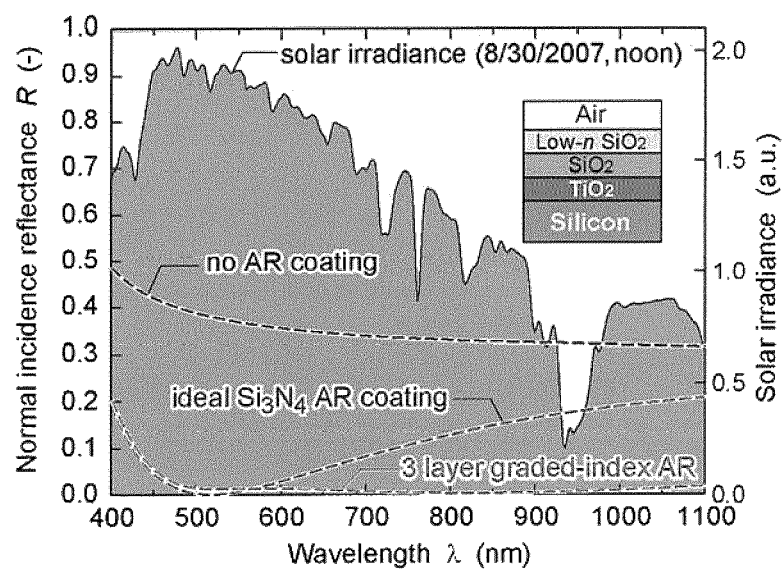
FIG. 20 shows the solar spectrum and reflectance of Si substrate as a function of wavelength with (a) no anti-reflection coating, (b) λ/4 anti-reflection coating, and (c) 3-layer anti-reflection coating.

Despite the early discovery of the photovoltaic (PV) effect by Alexandre-Edmond Becquerel in 1839 and almost 125 years since the first solar cell was built in 1883 by Charles Fritts, PV cells have only seen limited commercial success to date. The primary reason for this is the low efficiency and corresponding high cost per kilowatt-hour of energy produced by PV cells. Even today, Si solar cells have efficiency at best just over 20% and it has not improved much over last decade. Reflection of incident light from the surface of the solar cell is one of the major optical loss mechanisms seriously affecting the solar cell efficiency. FIG. 20 shows broadband nature of solar irradiance spectrum. Nearly 90% of commercial solar cells are made of crystalline Si. A polished Si surface, due to its high refractive index value, reflects as much as ~37% light, when averaged over all angles of incidence (0° to 90°) and over the range of wavelengths of the solar spectrum that can be absorbed by Si (400 nm to 1100 nm).

For several years, the reduction of reflection from the surface of the solar cell has been one of the primary focuses of solar cell research. Conventionally, a single layer anti-reflection coating with optical thickness equal to one quarter of the wavelength of interest is used. Ideally such single layer $\lambda/4$ anti-reflection coating should have refractive index, $n_{\lambda/4}$ as given by $n_{\lambda/4} = \sqrt{n_{semiconductor} \times n_{air}}$.

Often due to unavailability of materials desired, exact value of the refractive index, the performance of such $\lambda/4$ anti-reflection coatings deviates from the optimum. For example, $Si_3N_4$, which has refractive index value between that of Si and air, is used for Si solar cells. However these single layer anti-reflection coatings can fundamentally minimize reflection only for one specific wavelength and for one specific angle of incidence, typically for normal incidence. Thus, the conventional $Si_3N_4$ single layer anti-reflection coating is inherently unable to cover the broad range of wavelengths present in a solar spectrum and the broad range of incident angles. These coatings reduce the reflection to approximately ~18%. In order to further reduce reflection, surface texturing is often used, which has shown to reduce reflection to ~13%.

In this embodiment, the possibility of a near-perfect anti-reflection coating by complete elimination of Fresnel reflection is investigated. Lord Rayleigh, in 1880, mathematically demonstrated that graded-refractive-index layers have broadband anti-reflection properties. However, until recently, due to the unavailability of optical materials with very low refractive indices (n<1.4), such near-perfect graded-index anti-reflection coatings could not been realized.

Recently, a novel class of low-n materials having refractive index as low as 1.05 by using oblique angle deposition has been fabricated, as disclosed in J. Q. Xi et al. (J.-Q. Xi, et al., *Nature Photonics* Vol. 1, 176-179, 2007), and E. F.

Schubert et al. (E. F. Schubert et al., *Phys. Stat. Sol.* (*b*) 244, No. 8, 3002-3008, 2007), which are hereby incorporated by reference in their entireties. Consequently, it is now possible to tune the refractive indices of an optical material to virtually any value between its bulk value and that of air (~1).

In this embodiment, a systematic study of multilayer anti-reflection coatings is performed. For multilayer anti-reflection coatings, the refractive index of the layers is gradually decreased from the semiconductor to air. Since the solar spectrum, which is inherently broadband, is incident on the solar cell over a wide range of angles during the course of the day, it is important to use a figure of merit which gives a fair comparison of the performance of various anti-reflection coatings. Therefore, $R_{avg}$ defined as $$R_{avg} = \frac{1}{\Delta\lambda}\frac{1}{\Delta\theta}\int_{\lambda_{min}}^{\lambda_{max}}\int_{\theta_{min}}^{\theta_{max}} R \cdot d\theta d\lambda,$$

where θ is the zenith angle, is used as the figure of merit in this embodiment.

Figure 21A:
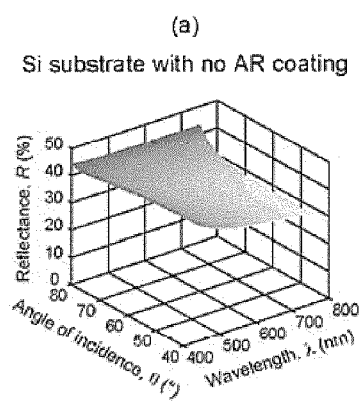
FIGS. 21A-21C show calculated wavelength and angle resolved absolute reflectance of Si substrate with 21A no anti-reflection coating, 21B λ/4 anti-reflection coating, and 21C 3-layer graded-index anti-reflection coating.
Figure 21B:
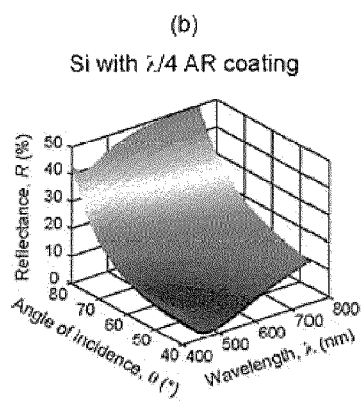
Figure 21C:
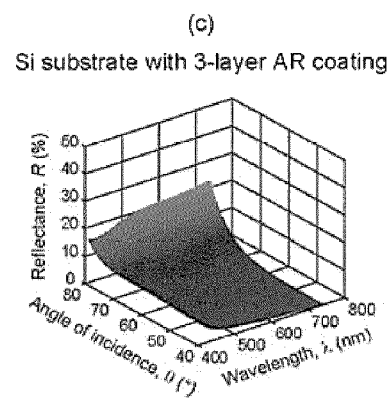

A MATLAB program is used to obtain optimized parameters, refractive index n and thickness t, for different anti-reflection coatings and different solar-cell materials. All coatings are optimized in the wavelength range of 400 nm to 1100 nm and incident angle range of 0° to 90°. For validation of the concept, a 3-layer anti-reflection coating optimized for polished Si solar cells is fabricated and characterized, as described below. For simplicity of design and fabrication, only the thickness t of each layer in the 3-layer graded-index is varied during optimization while keeping the refractive index n fixed for each. FIGS. 21A-21C show the surface plots of calculated reflectance for 21A bare polished Si substrate with no anti-reflection coating, 21B Si substrate with a conventional λ/4 $Si_3N_4$ anti-reflection coating, and 21C Si substrate with 3-layer graded-index anti-reflection coating. The results show significant advantages of the 3-layer graded-index anti-reflection coating in terms of drastically reduced reflectance over a wide range of wavelengths and angles of incidence.

Figure 22A:
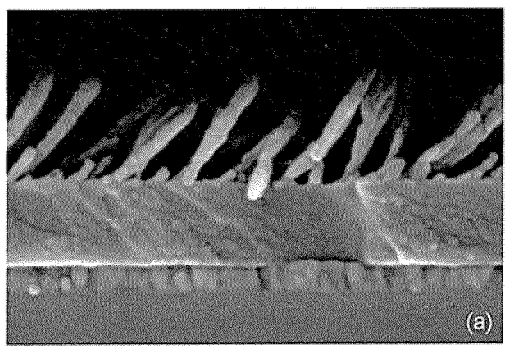
FIG. 22A shows a Scanning Electron Micrograph.
Figure 22B:
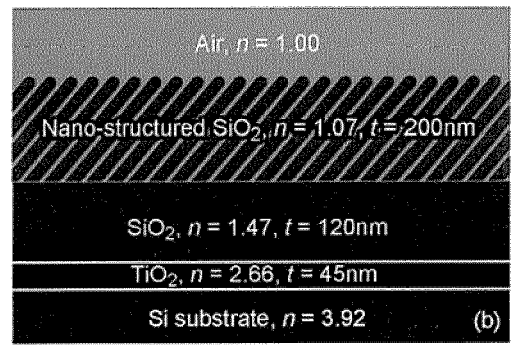
FIG. 22B shows a Schematic of 3-layer graded-index anti-reflection coating. The indicated refractive index values are measured at 550 nm.

Three samples are prepared using 1 cm×1 cm pieces of polished crystalline Si cut by a diamond scriber. Sample (a) is bare polished Si substrate with no anti-reflection coating. Sample (b) is Si substrate with a conventional λ/4 $Si_3N_4$ anti-reflection coating. Sample (c) is Si substrate with 3-layer graded-index anti-reflection coating. The λ/4 $Si_3N_4$ anti-reflection coating in sample (b) is deposited using a Plasma Enhanced Chemical Vapor Deposition (PECVD) tool and is optimized for lowest normal incidence reflection at 550 nm wavelength and has refractive index, n=2.2 measured at 550 nm and thickness, t=62.5 nm. The 3-layers anti-reflection coating is deposited over a polished crystalline Si substrate using RF sputtering for the first two layers and oblique angle e-beam evaporation for the third layer. As shown in FIG. 22B, the anti-reflection coating is composed of a first layer of $TiO_2$ (n=2.66 at a wavelength of 550 nm), a second layer of $SiO_2$ (n=1.47 at a wavelength of 550 nm), and a third layer of low-n $SiO_2$ (n=1.07 at a wavelength of 550 nm). The thickness of each layer is 45 nm, 120 nm, and 200 nm, respectively. The first layer of $TiO_2$ is deposited by reactive sputtering a 2 inch $TiO_2$ target for 57 minutes, under 200 W of RF sputtering power, 5.0 sccm of Ar, 0.5 sccm of $O_2$, and an operating pressure of 2 mTorr. Substrate bias of 5 W and substrate temperature of 500° C. are used to achieve high refractive index value of 2.66 at a wavelength of 550 nm. The second layer of $SiO_2$ is deposited by reactive sputtering a 2 inch $SiO_2$ target for 60 minutes, under 200 W of RF sputtering power, 5.0 sccm of Ar, 0.5 sccm of $O_2$, and an operating pressure of 2 mTorr. Substrate bias of 5 W is used without any external heating. The third layer of porous $SiO_2$ is deposited using oblique angle e-beam evaporation technique. The desired low refractive-index is achieved by mounting the sample in such a way that the substrate normal is 85° to the incoming flux. Details of the oblique angle evaporation technique have been described in Martin F. Schubert, et al. (Martin F. Schubert, et al., *App. Phys. Lett.* 90, 141115, 2007), K. Robbie et al. (K. Robbie et al., *J. Vac. Set. Technol. A* 15 (3), 1460-1465, 1997), and K. Robbie, et al. (K. Robbie, et al., *J. Vac. Sci. Technol. B* 16 (3), 1115-1122, 1998), which are hereby incorporated by reference in their entireties. The thickness and R.I. values are measured using variable angle spectroscopic ellipsometry. Thickness is confirmed by images of scanning electron microscopy (SEM) for example the SEM image of the 3-layer anti-reflection coating as shown in FIG. 22A.

The absolute reflectance of samples (a), (b), and (c) is measured using the VASE M44 variable angle spectroscopic ellipsometry. For each sample, data are measured for 44 discreet values of the wavelength between 400 nm and 750 nm, which were predetermined by the instrument and for incident angle range between 40° and 80° with 1° increments. The measurement is done for one specific polarization at a time. This totals to 1804 data points for each polarization within the window of desired range of wavelengths and incident angles for each sample. A large number of data points are measured to ensure accuracy in $R_{avg}$. FIGS. 23A-23C show the surface plots of the measured absolute reflectance data of the samples. FIG. 23C, in contrast with FIG. 23B, shows very-low reflectance over a wide range of wavelengths and incident angles, clearly demonstrating the broadband and omni-directional characteristics of the 3-layer graded-index anti-reflection coating.

Figure 24:
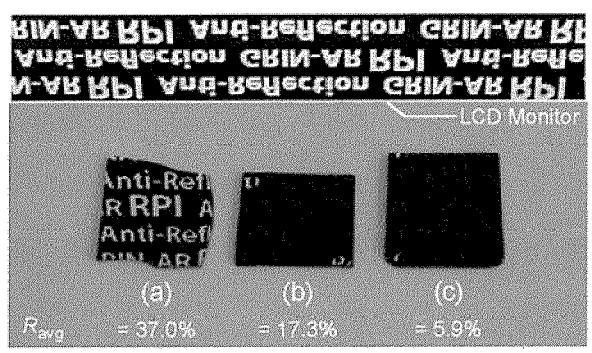
FIG. 24 shows photographs of Si substrate with (a) no anti-reflection coating, (b) λ/4 anti-reflection coating, and (c) 3-layer graded-index anti-reflection coating.

The measured absolute reflectance results are in excellent agreement with the theoretically calculated values shown in FIGS. 21A-21C. The $R_{avg}$ values of samples (a), (b), and (c) are 37.0%, 17.3%, and 5.9%, respectively. FIG. 24 shows the photograph of the three samples for side-by-side comparison. The λ/4 anti-reflection coating shows blue color due to its significantly high reflectance in the wavelength range below the zero-reflection wavelength. The superiority of the 3-layer anti-reflection coating is clearly observable.

In summary, this embodiment demonstrates an ultra-low reflectance, broadband, omni-directional, graded-index anti-reflection coating. The availability of the novel nanostructured low-n materials deposited by oblique angle deposition technique has allowed a design of near-perfect anti-reflection coatings which can be used in wide variety of applications. Measurements show dramatic reduction in reflection over wide range of incident angles and broad range of wavelengths in comparison with conventional λ/4 anti-reflection coatings. The average reflectance, $R_{avg}$, of 5.9% was measured for the triple-layer graded-index anti-reflection coating as compared to 17.3% for the conventional $Si_3N_4$ λ/4 anti-reflection coating widely used for Si solar cells. These values are in excellent agreement with the theoretical calculations which predict $R_{avg}$ of 4.9% for the triple-layer graded-index anti-reflection coating and 18.2% for the λ/4 anti-reflection coating. This broadband and omni-directional character of the anti-reflection coating of this embodiment is very well suited for application in solar cells and other applications.

Embodiment VI

The antireflective coatings described herein may be used with any suitable device in which antireflective coatings are used, such as photodetectors and solar cells (i.e., photovoltaic cells). A solar cell includes a first electrode, a second electrode and a photovoltaic material located between the electrodes.

At least one of the electrodes which faces the Sun is transparent to solar radiation. For example, the electrode is made of a transparent material, such as a transparent conductive oxide (e.g., indium tin oxide, zinc oxide, aluminum zinc oxide, etc.) and/or is formed in a shape of a grid or mesh such that the solar radiation may be incident on the photovoltaic material between the grid or mesh lines. As used herein, transparent means transmitting at least 50%, such as at least 75% of incident solar radiation and should not be interpreted as being limited to 100% transmission of solar radiation. The other electrode may comprise any suitable conductor, such as a metal or metal alloy, including Al, Cu, Ti, Au, Ag, steel, etc.

The photovoltaic material may comprise one or more layers of organic and/or inorganic semiconductor photovoltaic material. Organic photovoltaic materials include photovoltaic polymers. Inorganic photovoltaic materials include Group IV semiconductors, such as silicon, germanium, etc., and compound semiconductor materials, such as binary, ternary or quaternary materials, including CdTe, GaAs, InP, GaAlAs, etc. The photovoltaic material may comprise a single junction (i.e., p-n or p-i-n junction) or multi junction material. Alternatively, the photovoltaic material may comprise a single layer of semiconductor material arranged in a Schottky junction configuration (i.e., a junction between the semiconductor material and an adjacent metal electrode).

The solar cell may be formed on a transparent substrate, such as glass, quartz, plastic, polymer, etc., which faces the Sun. In this case, the transparent electrode is located between the transparent substrate and the photovoltaic material. The anti-reflection coating may be located between the transparent substrate and the transparent electrode. Alternatively, the anti-reflection coating may be located between the photovoltaic material and the transparent electrode, especially if the transparent electrode has a grid or mesh shape. If desired, a second anti-reflection coating may be added over the transparent substrate instead of or in addition to the anti-reflection coating located between the substrate and the rest of the solar cell.

Alternatively, the solar cell may be formed on a non-transparent substrate, such as a metal, ceramic or semiconductor substrate. In this case, the non-transparent electrode is formed between the substrate and one side of the photovoltaic material. The transparent electrode is formed over the opposite side of the photovoltaic material. An optional transparent encapsulating material, such as a polymer, glass or epoxy material, is formed over the transparent electrode. The anti-reflection coating may be located between the encapsulating material and the transparent electrode. Alternatively, the anti-reflection coating may be located between the photovoltaic material and the transparent electrode, especially if the transparent electrode has a grid or mesh shape. If desired, a second anti-reflection coating may be added over the encapsulating material instead of or in addition to the anti-reflection coating located between the encapsulating material and the rest of the solar cell.

The solar cell may be a concentrator type cell (e.g., a relatively small cell, such as a multi-junction cell used with a concentrator device, such as a lens) or a large area panel type cell.

Features from any embodiment may be used in any combination with one or more features from the same or one or more different embodiments. The forgoing description of the invention has been presented for purpose of illustration and description. It is not intended to be exhaustive or limit the invention to the precise from disclosed, and modifications and variations are possible in light of the above teachings or may be acquired from practice of the invention. The description was chosen in order to explain the principles of the invention. The description was chosen in order to explain the principle of the invention and its practical application. It is intended that the scope of the invention be defined by the claims appended hereto, and their equivalents. All references disclosed herein are incorporated by reference in their entirety.

What is claimed is:

1. A structure comprising:
   a silicon substrate; and
   an antireflection coating on the silicon substrate, the antireflection coating comprising:
   two bottom layers made of titanium oxide;
   three middle layers made of co-sputtered silicon oxide and titanium oxide; and
   two top layers made of slanted silicon oxide nanorods, the slanted silicon oxide nanorods are tilted along the same direction, have a diameter of 20-30 nm, and have a rod-to-rod spacing of 50-100 nm.

2. The structure of claim 1, wherein a first of the top two layers made of slanted silicon oxide nanorods has a refractive index of n=1.22, and a second of the top two layers made of slanted silicon oxide nanorods has a refractive index of n=1.09.

3. The structure of claim 2, wherein the antireflection coating further comprises a barrier layer located between the two top layers made of slanted silicon oxide nanorods.

4. The structure of claim 1, wherein the two top layers made of slanted silicon oxide nanorods having a porosity from 10% to 90%.

5. The structure of claim 1, wherein the slanted silicon oxide nanorods have a tilt angle of 0 to 60 degrees with respect to surface normal.

6. The structure of claim 1, wherein the antireflection coating has refraction index values varying discretely from about 3.6 to about 1; and an index of refraction profile of the anti-reflection coating has an approximate Gaussian or Quintic distribution and is smooth to a first derivative and a second derivative.

7. The structure of claim 1, wherein the antireflection coating has index of refraction values that vary discretely from about 2.6 to about 1.09; and an index of refraction profile of the antireflection coating has an approximate Gaussian or Quintic distribution and is smooth to a first derivative and a second derivative.

8. The structure of claim 1, wherein the antireflection coating has a continuous index of refraction profile varying from about 3.6 to about 1; and the index of refraction profile has an approximate Gaussian or Quintic distribution.

9. The structure of claim 1, wherein the antireflection coating has a continuous index of refraction profile varying from about 2.6 to about 1.09; and the index of refraction profile has an approximate Gaussian or Quintic distribution.

10. The structure of claim 1, wherein the antireflection coating has a total thickness of 1-5 optical wavelengths.

11. The structure of claim 1, which is a solar cell comprising a first electrode located over the substrate; at least one photovoltaic layer located over the first electrode; a second electrode located over the at least one photovoltaic layer; and the antireflection coating located over the second electrode.

12. The structure of claim 1, wherein the antireflection coating is optically smooth to within about $\frac{1}{10} \lambda$.

13. The structure of claim 1, wherein the antireflection coating has an angle average total reflectance of about 5.9% over a spectrum of wavelengths of 400-1100 nm and over angles of incidence ranging from 0-90 degrees with respect to a surface normal of antireflection coating.

14. The structure of claim 1, wherein a first bottom layer has a thickness of 69 nm, a second bottom layer has a thickness of 78 nm, a first middle layer has a thickness of 81 nm, a second middle layer has a thickness of 101 nm, a third middle layer has a thickness of 113 nm, a first top layer has as thickness of 145 nm, and a second top layer has a thickness of 156 nm.

15. The structure of claim 1, wherein the antireflection coating has an angle average total reflectance of 1-6% over a spectrum of wavelengths of 400-1600 nm and over angles of incidence ranging from 0-60 degrees with respect to a surface normal of the antireflection coating.

* * * * *